(12) United States Patent
Hahn

(10) Patent No.: US 10,102,912 B2
(45) Date of Patent: Oct. 16, 2018

(54) NONVOLATILE MEMORY DEVICE AND ERASING METHOD OF NONVOLATILE MEMORY DEVICE

(71) Applicant: SAMSUNG ELECTRONICS CO., LTD., Suwon-si, Gyeonggi-Do (KR)

(72) Inventor: Wookghee Hahn, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/496,441

(22) Filed: Apr. 25, 2017

(65) Prior Publication Data
US 2017/0372785 A1 Dec. 28, 2017

(30) Foreign Application Priority Data
Jun. 27, 2016 (KR) .................. 10-2016-0080280

(51) Int. Cl.
| G11C 16/16 | (2006.01) |
| G11C 16/34 | (2006.01) |
| G11C 16/08 | (2006.01) |
| G11C 16/04 | (2006.01) |

(52) U.S. Cl.
CPC .......... *G11C 16/16* (2013.01); *G11C 16/08* (2013.01); *G11C 16/3459* (2013.01); *G11C 16/0466* (2013.01); *G11C 16/0483* (2013.01); *G11C 16/3445* (2013.01); *G11C 2216/18* (2013.01)

(58) Field of Classification Search
CPC . G11C 16/16; G11C 16/3459; G11C 16/0483; G11C 2216/18
See application file for complete search history.

(56) References Cited

U.S. PATENT DOCUMENTS

| 5,917,755 | A | 6/1999 | Rinerson et al. |
| 6,188,609 | B1 | 2/2001 | Sunkavalli et al. |
| 6,222,770 | B1 | 4/2001 | Roohparvar |
| 7,382,651 | B2* | 6/2008 | Nagao ............. G11C 16/16 |
| | | | 365/185.11 |
| 7,499,325 | B2 | 3/2009 | Doyle et al. |
| 7,532,531 | B2 | 5/2009 | Lee |
| 7,679,133 | B2 | 3/2010 | Son et al. |

(Continued)

FOREIGN PATENT DOCUMENTS

KR 1020150125672 11/2015

*Primary Examiner* — Vanthu Nguyen
(74) *Attorney, Agent, or Firm* — F. Chau & Associates, LLC

(57) ABSTRACT

A memory cell array includes a plurality of memory blocks, each memory block having a plurality of memory cells stacked on a substrate in a direction perpendicular to the substrate. A row decoder circuit is connected to the plurality of memory cells through a plurality of word lines, selecting a first memory block of the plurality of memory blocks. A page buffer circuit is connected to the plurality of memory cells through a plurality of bit lines. A control logic circuit applies an erase voltage to the substrate during an erase operation, outputting a word line voltage having a first word line voltage and a second word line voltage to the row decoder circuit. During the erase operation, the row decoder circuit applies the first word line voltage to each word line of the first memory block and then applies the second word line voltage to each word line.

13 Claims, 19 Drawing Sheets

(56) References Cited

U.S. PATENT DOCUMENTS

| | | | |
|---|---|---|---|
| 8,014,209 B2* | 9/2011 | Lutze | G11C 11/5635 |
| | | | 365/185.24 |
| 8,274,837 B2* | 9/2012 | Nakamura | G11C 16/16 |
| | | | 365/185.17 |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,705,289 B2 | 4/2014 | Yang et al. | |
| 8,891,308 B1 | 11/2014 | Ou et al. | |
| 8,917,558 B2* | 12/2014 | Han | G11C 16/16 |
| | | | 365/185.05 |
| 9,355,731 B2* | 5/2016 | Shiga | G11C 16/14 |
| 9,842,851 B2* | 12/2017 | Pachamuthu | H01L 27/11582 |
| 2011/0233648 A1 | 9/2011 | Seol et al. | |
| 2014/0247666 A1 | 9/2014 | Dutta et al. | |

* cited by examiner

NONVOLATILE MEMORY DEVICE AND ERASING METHOD OF NONVOLATILE MEMORY DEVICE

CROSS-REFERENCE TO RELATED APPLICATION

This application claims priority under 35 U.S.C. § 119 to Korean Patent Application No. 10-2016-0080280 filed Jun. 27, 2016, in the Korean Intellectual Property Office, the disclosure of which is incorporated by reference in its entirety.

TECHNICAL FIELD

The present inventive concept relates to a nonvolatile memory device and an erasing method of the nonvolatile memory device.

DISCUSSION OF RELATED ART

Storage devices refer to a device storing data under control of a host device, such as a computer, a smartphone, and a smart pad. The storage devices include a semiconductor memory, in particular, a nonvolatile memory, such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc.

The degree of integration of the storage device and a volume thereof continue to increase as semiconductor manufacturing technologies develop. The high degree of integration of the storage device makes it possible to reduce costs needed to manufacture the storage device. However, the high degree of integration of the storage device causes a scale-down and a structure change of the storage device, and thus various new issues occur. Since such issues cause a damage of data stored in the storage device, the ability to store data may be damaged. This may mean that the reliability of the storage device decreases.

SUMMARY

According to an exemplary embodiment of the present inventive concept, a nonvolatile memory device is provided as follows. A memory cell array includes a plurality of memory blocks. Each of the plurality of memory blocks includes a plurality of memory cells stacked on a substrate in a direction perpendicular to the substrate. A row decoder circuit is connected to the plurality of memory cells through a plurality of word lines, selecting a first memory block of the plurality of memory blocks. A page buffer circuit is connected to the plurality of memory cells through a plurality of bit lines. A control logic circuit applies an erase voltage to the substrate during an erase operation, outputting a word line voltage having a first word line voltage and a second word line voltage to the row decoder circuit. During the erase operation, the row decoder circuit applies the first word line voltage to each word line of the first memory block and then applies the second word line voltage to each word line.

According to an exemplary embodiment of the present inventive concept, a nonvolatile memory device is provided as follows. A memory cell array includes a plurality of memory blocks. Each of the plurality of memory blocks includes a plurality of memory cells stacked on a substrate in a direction perpendicular to the substrate. A row decoder circuit is connected to the plurality of memory cells through a plurality of word lines, selecting a first memory block of the plurality of memory blocks. A page buffer circuit is connected to the plurality of memory cells through a plurality of bit lines. A control logic circuit applies an erase voltage to the substrate during an erase operation. During the erase operation, the control logic circuit increases a level of the erase voltage to a target level with at least one hold time period in which a level of the erase voltage is maintained as constant before the level of the erase voltage reach the target level. During the erase operation, the row decoder circuit applies a word line voltage to each word line of the first memory block. A voltage of each word line of the first memory block rises to a level higher than a word line target level of the word line voltage while a level of the erase voltage increases and a voltage of each word line decreases during the at least one hold time period.

According to an exemplary embodiment of the present inventive concept, a nonvolatile memory device is provided as follows. The nonvolatile memory device includes a plurality of memory cells stacked on a substrate in a direction perpendicular to the substrate. The plurality of memory cells is erased in a gradual erase interval in which an amount of charges discharged from the memory cells gradually increases and in a fixed erase interval in which a voltage difference between the substrate and a control gate each of the plurality of memory cells is maintained as constant. The erasing of the plurality of memory cells is performed by at least one of applying a first erase voltage to the substrate and applying a first voltage and a second voltage to the control gate of each of the plurality of memory cells, wherein the second voltage is greater than the first voltage and wherein the applying of the first voltage is followed by the applying of the second voltage and applying a second erase voltage to the substrate with at least one hold time period and applying a word line voltage to the control gate of each of the plurality of memory cells, wherein the second erase voltage is maintained for the at least one hold time period, and wherein the word line voltage increases until each of the at least one hold time period starts and the word line voltage decrease for each of the at least one hold time period.

According to an exemplary embodiment of the present inventive concept, a nonvolatile memory device is provided as follows. The nonvolatile memory device includes a voltage generation circuit and a plurality of memory cells stacked on a substrate in a direction perpendicular to the substrate. The voltage generation circuit generates a word line voltage having a first word line voltage and a second word line voltage. The voltage generation circuit outputs the first word line voltage at a first capacity and the second word line voltage at a second capacity. An erase voltage is applied to the substrate. The word line voltage is applied to a control gate of the plurality of memory cells. The word line voltage is applied to the control gate of the plurality of memory cells while the erase voltage is applied to the substrate. The word line voltage is changed at a predetermined time from the first word line voltage to the second word line voltage while the erase voltage is applied to the substrate.

BRIEF DESCRIPTION OF DRAWINGS

These and other features of the inventive concept will become more apparent by describing in detail exemplary embodiments thereof with reference to the accompanying drawings of which.

DETAILED DESCRIPTION

Below, embodiments of the inventive concept will be described in detail with reference to the attached drawings to the extent that the embodiments of the inventive concept are easily implemented by an ordinary one in the art.

Figure 1:
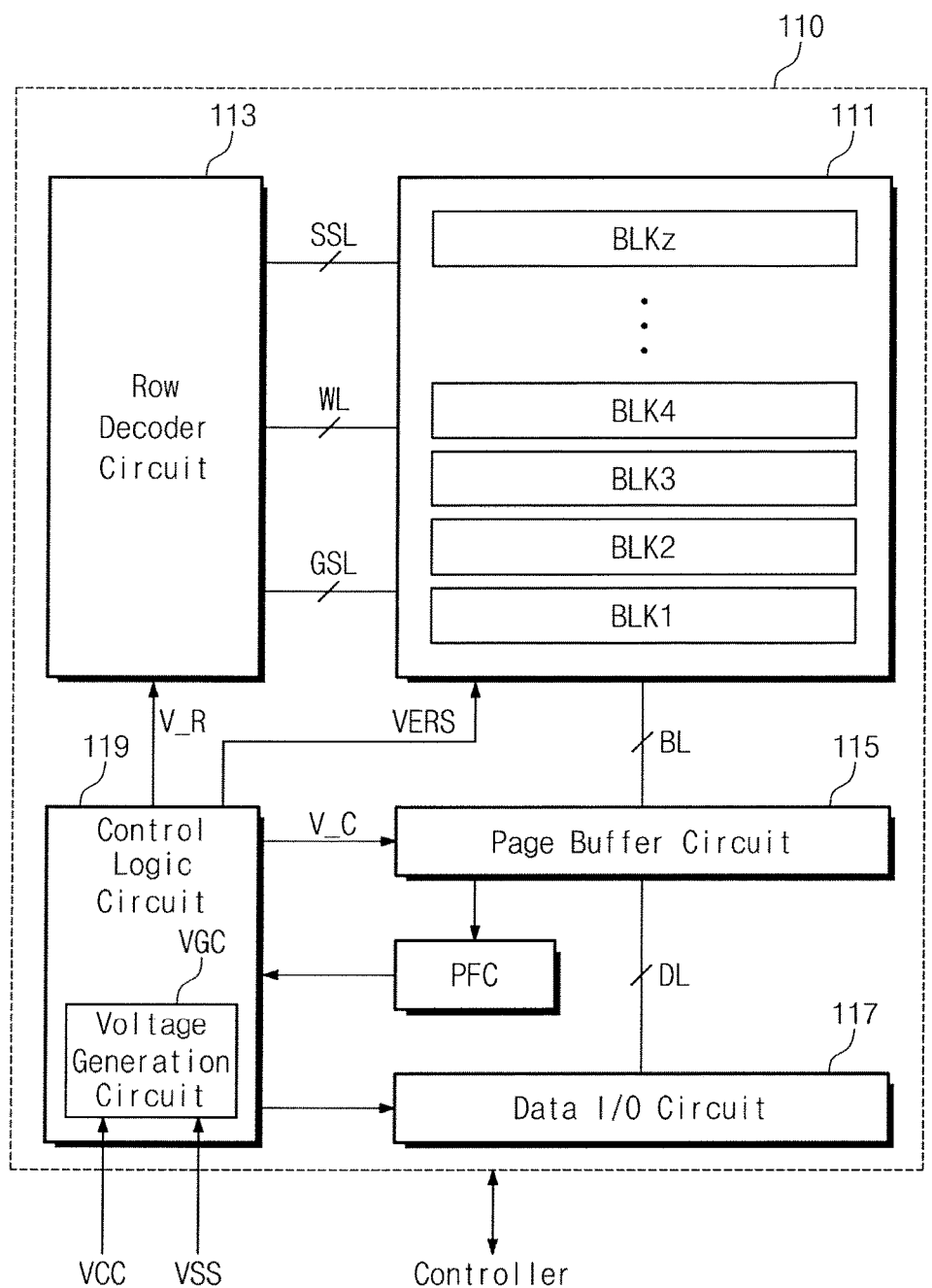
FIG. 1 is a block diagram illustrating a nonvolatile memory device according to an embodiment of the inventive concept.

FIG. 1 is a block diagram illustrating a nonvolatile memory device 110 according to an embodiment of the inventive concept. Referring to FIG. 1, the nonvolatile memory device 110 includes a memory cell array 111, a row decoder circuit 113, a page buffer circuit 115, a pass/fail check circuit PFC, a data input/output circuit 117, and a control logic circuit 119.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 113 through a plurality of ground selection lines GSL, a plurality of word lines WL, and a plurality of string selection lines SSL. Each of the memory blocks BLK1 to BLKZ may be connected to the page buffer circuit 115 through a plurality of bit lines BL. The memory blocks BLK1 to BLKz may be connected in common to the bit lines BL. The memory cells in the memory blocks BLK1 to BLKz may have the same structure.

In an embodiment, each of the memory blocks BLK1 to BLKz may be a unit of an erase operation. The memory cells in the memory cell array 111 may be erased in units of memory blocks. The memory cells belonging to a memory block may be erased at the same time. The present inventive concept is not limited thereto. For example, each of the memory blocks BLK1 to BLKz may be divided into a plurality of sub-blocks. In this case, each of the plurality of sub-blocks may be a unit of an erase operation.

In an embodiment, each of the memory blocks BLK1 to BLKz may include a physical storage space that is selected using a block address. Each of the word lines WL may correspond to a physical storage space that is selected using a row address. Each of the bit lines BL may correspond to a physical storage space that is distinguished by a column address.

The row decoder circuit 113 may be connected to the memory cell array 111 through the plurality of ground selection lines GSL, the plurality of word lines WL, and the plurality of string selection lines SSL. The row decoder circuit 113 operates according to control of the control logic circuit 119. The row decoder circuit 113 may decode an address received from a controller 120 (refer to FIG. 23) through an input/output channel and may control application of voltages to the string selection lines SSL, the word lines WL, and the ground selection lines GSL based on the decoded address.

For example, during a program operation, the row decoder circuit 113 may apply a program voltage to a selected word line in a memory block selected by an address and may apply a pass voltage to each unselected word line in the selected memory block. During a read operation, the row decoder circuit 113 may apply a selection read voltage to a selected word line in a memory block selected by an address and may apply a non-selection read voltage to each unselected word line in the selected memory block. During an erase operation, the row decoder circuit 113 may apply erase voltages (e.g., a ground voltage or low voltages of which the levels are similar to that of the ground voltage) to word lines in a memory block selected by an address.

The page buffer circuit 115 is connected to the memory cell array 111 through the bit lines BL. The page buffer circuit 115 is connected to the data input/output circuit 117 through a plurality of data lines DL. The page buffer circuit 115 operates under control of the control logic circuit 119.

During the program operation, the page buffer circuit 115 may store data to be programmed in memory cells. The page buffer circuit 115 may apply voltages to the bit lines BL based on the stored data. For example, the page buffer circuit 115 may function as a write driver. During the read operation or a verification read operation, the page buffer circuit 115 may sense voltages on the bit lines BL and may store the sensed result therein. For example, the page buffer circuit 115 may function as a sense amplifier.

After the verification read operation, the pass/fail check circuit PFC may receive the sensed result from the page buffer circuit 115. The pass/fail check circuit PFC may determine a program pass or a program fail based on the received sensed result. For example, during a program verification read operation, the page buffer circuit 115 may count the number of on-cells that are turned on. When the number of on-cells is greater than or equal to a threshold value, the pass/fail check circuit PFC may determine a fail. When the number of on-cells is smaller than the threshold value, the pass/fail check circuit PFC may determine a pass. For example, during an erase verification read operation, the page buffer circuit 115 may count the number of off-cells that are turned off. When the number of off-cells is greater than or equal to a threshold value, the pass/fail check circuit PFC may determine a fail. When the number of on-cells is smaller than the threshold value, the pass/fail check circuit PFC may determine a pass. The determination result may be provided to the control logic circuit 119.

The data input/output circuit 117 is connected with the page buffer circuit 115 through the data lines DL. The data input/output circuit 117 may output data, which is read by the page buffer circuit 115, to the controller 120 through the input/output channel and may provide data, which is received from the controller 120 (refer to FIG. 23) through the input/output channel, to the page buffer circuit 115.

The control logic circuit 119 may receive a command from the controller 120 through the input/output channel and may receive a control signal therefrom through a control channel. The control logic circuit 119 may receive a command, which is provided through the input/output channel, in response to the control signal, may route an address, which is provided through the input/output channel, to the row decoder circuit 113, and may route data, which is provided through the input/output channel, to the data input/output circuit 117. The control logic circuit 119 may decode the received command and may control the nonvolatile memory device 110 based on the decoded command.

The control logic circuit 119 may include a voltage generation circuit VGC. The voltage generation circuit VGC may receive a power supply voltage VCC and a ground voltage VSS from an external controller. The voltage generation circuit VGC may generate row voltages V_R and column voltages V_C based on the power supply voltage VCC. The row voltages V_R may be voltages that are applied to the word lines WL, the string selection lines SSL, or the ground selection lines GSL during a program operation, the read operation, or an erase operation. The column voltages V_C may be voltages that are applied to the bit lines BL during a program operation, a read operation, or an erase operation. For example, the row voltages V_R or the column voltages V_C may be positive voltages or negative voltages except the ground voltage VSS. In an exemplary embodiment, the row voltages V_R may include word line voltages generated by a voltage generation circuit VGC. The voltage generation circuit VGC will be described with reference to FIG. 10.

The voltage generation circuit VGC may generate an erase voltage VERS based on the power supply voltage VCC. The erase voltage VERS may be a voltage that is applied to a substrate of the memory cell array 111 during an erase operation. The erase voltage VERS may be a high voltage that is generated by a charge pump.

The voltage generation circuit VGC may provide the ground voltage VSS from the external controller as a global ground voltage of the nonvolatile memory device 110. For example, the global ground voltage may be provided to a common ground of the memory cell array 111, the row decoder circuit 113, the page buffer circuit 115, the data input/output circuit 117, and the control logic circuit 119.

Figure 2:
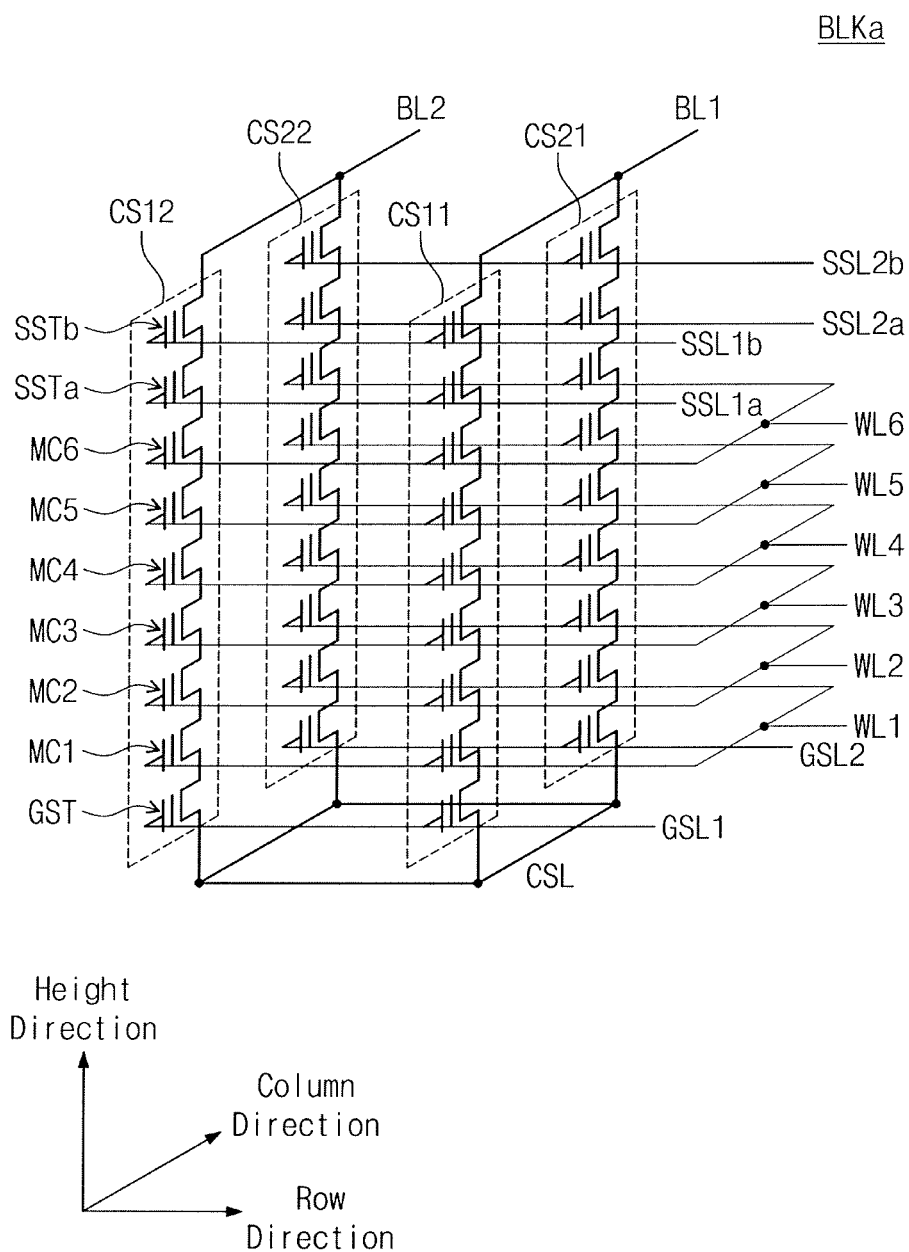
FIG. 2 is a circuit diagram illustrating a memory block according to an embodiment of the inventive concept.

FIG. 2 is a circuit diagram illustrating a memory block BLKa according to an embodiment of the inventive concept. Referring to FIG. 2, the memory block BLKa includes a plurality of cell strings CS11 to CS21 and CS12 to CS22. The cell strings CS11 to CS21 and CS12 to CS22 may be arranged along a row direction and a column direction into rows and columns.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may include a plurality of cell transistors. In each cell string, the cell transistors include a ground selection transistor GST, memory cells MC1 to MC6, and string selection transistors SSTa and SSTb. The ground selection transistor GST, the memory cells MC1 to MC6, and the string selection transistors SSTa and SSTb of each cell string may be stacked in a height direction perpendicular to a plane (e.g., a plane on a substrate of the memory block BLKa) in which the cell strings CS11 to CS21 and CS12 to CS22 are arranged along the rows and the columns.

Each cell transistor may be a charge trap type cell transistor of which the threshold voltage changes according to the amount of charges trapped in an insulating layer thereof.

Sources of the lowermost ground selection transistors GST may be connected in common to a common source line CSL.

Control gates of the ground selection transistors GST of the cell strings CS11 and CS12 in the first row are connected in common to a ground selection line GSL1, and control gates of the ground selection transistors GST of the cell strings CS21 and CS22 in the second row are connected in common to a ground selection line GSL2. For example, cell strings in different rows are connected to different ground selection lines.

Control gates of memory cells that are placed at the same height (or order) from the substrate (or the ground selection transistors GST) may be connected in common to a word line. Control gates of memory cells that are placed at different heights (or, orders) may be connected to different word lines WL1 to WL6. For example, the memory cells MC1 are connected in common to a word line WL1. The memory cells MC2 are connected in common to a word line WL2. The memory cells MC3 are connected in common to a word line WL3. The memory cells MC4 are connected in common to a word line WL4. The memory cells MC5 are connected in common to a word line WL5. The memory cells MC6 are connected in common to a word line WL6.

In the first string selection transistors SSTa of the cell strings CS11 to CS21 and CS12 to CS22 that have the same height (or order), control gates of the first string selection transistors SSTa in different rows are respectively connected to different string selection lines SSL1a and SSL2a. For example, the first string selection transistors SSTa of the cell strings CS11 and CS12 are connected in common to the string selection line SSL1a. The first string selection transistors SSTa of the cell strings CS21 and CS22 are connected in common to the string selection line SSL2a.

In the second string selection transistors SSTb of the cell strings CS11 to CS21 and CS12 to CS22 which have the same height (or order), control gates of the second string selection transistors SSTb in different rows are respectively connected to different string selection lines SSL1*b* and SSL2*b*. For example, the second string selection transistors SSTb of the cell strings CS11 and CS12 are connected in common to the string selection line SSL1*b*. The second string selection transistors SSTb of the cell strings CS21 and CS22 are connected in common to the string selection line SSL2*b*.

For example, cell strings in different rows are connected to different string selection lines. String selection transistors, which have the same height (or, order), from among cell strings in the same row are connected to the same string selection line. String selection transistors, which have different heights (or, orders), from among cell strings in the same row are connected to different string selection lines.

In an embodiment, string selection transistors of cell strings in the same row may be connected in common to a string selection line. For example, the string selection transistors SSTa and SSTb of the cell strings CS11 and CS12 in the first row may be connected in common to a string selection line. The string selection transistors SSTa and SSTb of the cell strings CS21 and CS22 in the second row may be connected in common to a string selection line.

Columns of the cell strings CS11 to CS21 and CS12 to CS22 are respectively connected to different bit lines BL1 and BL2. For example, the string selection transistors SSTb of the cell strings CS11 and CS21 in the first column are connected in common to the bit line BL1. The string selection transistors SST of the cell strings CS12 and CS22 in the second column are connected in common to the bit line BL2.

In the memory block BLKa, memory cells that is placed at the same height from the substrate share a word line. The memory cells of the memory block BLKa do not share the word lines with different memory blocks. For example, a memory cell of a first memory block placed at a first height may share a word line with another memory cell of the first memory block placed at the first height. The memory cell of the first memory block placed at the first height need not share a word line with a memory cell of a second memory block placed at the first height. A sub-block may be a part of the memory block BLKa.

As described above, the memory block BLKa may be provided at a three-dimensional (3D) memory array. The 3D memory array is monolithically formed in one or more physical levels of arrays of memory cells MC1 to MC6 having an active area disposed above a silicon substrate and a circuitry associated with the operation of those memory cells MC1 to MC6. The circuit associated with an operation of memory cells MC1 to MC6 may be located above or within such substrate. The term "monolithic" means that layers of each level of the array are directly deposited on the layers of each underlying level of the 3D memory array.

In an embodiment of the inventive concept, due to a vertical directivity, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC1 to MC6. The at least one selection transistor may have the same structure as the memory cells MC1 to MC6 and may be formed uniformly with the memory cells MC1 to MC6.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
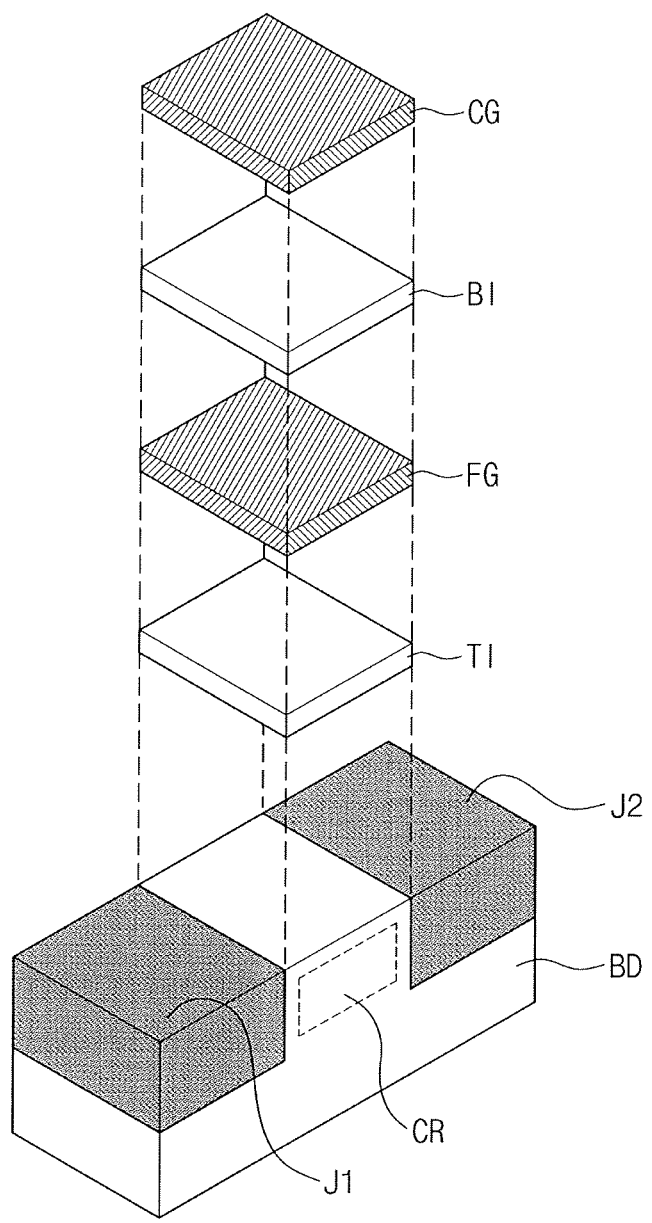
FIG. 3 is a perspective view of a structure of a two-dimensional or planar memory cell.

FIG. 3 is a perspective view of a structure of a two-dimensional (2D) or planar memory cell. Referring to FIG. 3, first and second junctions J1 and J2 of an N type may be formed in a P-type body BD. A region of the body BD, which is between the first and second junctions J1 and J2, may be a channel region CR where a channel is defined.

A tunnel insulating layer TI, a floating gate FG, a blocking insulating layer BI, and a control gate CG may be sequentially stacked on the channel region CR. The control gate CG may be connected to a word line. The control gate CG and the channel region CR may have a rectangular, flat shape, and capacitance may be defined between the control gate CG and the channel region CR based on the rectangular and flat shapes thereof. The capacitance may cause coupling between the control gate CG and the channel region CR.

Figure 4:
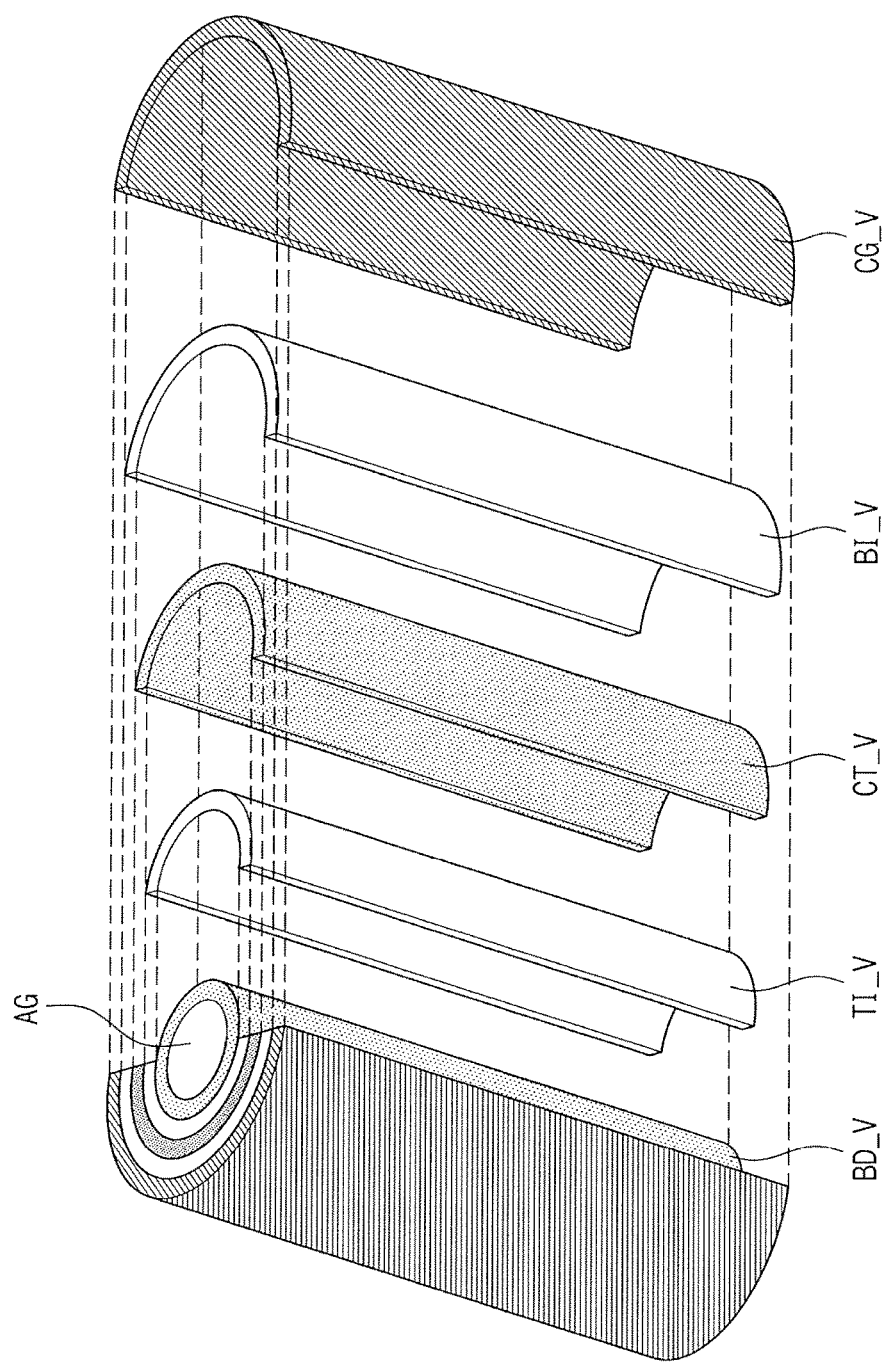
FIG. 4 is a perspective view of a structure of a 3D memory cell described with reference to FIG. 2.

FIG. 4 is a perspective view of a structure of a 3D memory cell described with reference to FIG. 2. Referring to FIG. 4, a vertical body BD_V of a cylindrical shape may be provided. The vertical body BD_V may extend in a direction perpendicular to a substrate. The vertical body BD_V may have P-type or may be intrinsic silicon. An air gap AG of a cylindrical shape may be defined in the interior of the vertical body BD_V.

A vertical tunnel insulating layer TI_V of a cylindrical shape may be provided on an outer surface of the vertical body BD_V. A vertical charge trap layer CT_V of a cylindrical shape may be provided on an outer surface of the vertical tunnel insulating layer TI_V. A vertical blocking insulating layer BI_V of a cylindrical shape may be provided on an outer surface of the vertical charge trap layer CT_V. A vertical control gate CG_V of a cylindrical shape may be provided on an outer surface of the vertical blocking insulating layer BI_V. The vertical control gate CG_V may be connected to a word line.

Each of the vertical control gate CG_V and the vertical body BD_V has a cylindrical shape, and capacitance is defined between the vertical control gate CG_V and the vertical body BD_V based on the cylindrical shapes thereof. The capacitance may cause coupling between the vertical control gate CG_V and the vertical body BD_V.

In the flat structure of the 2D memory cell of FIG. 3 and the cylindrical structure of the 3D memory cell of FIG. 4, the capacitance of the 3D memory cell of FIG. 4 is greater than the capacitance of the 2D memory cell of FIG. 3. For example, when the size of the 2D memory cell of FIG. 3 is the same as the size of the 3D memory cell of FIG. 4, the capacitance between the vertical body BD_V and the vertical control gate CG_V of the 3D memory cell of FIG. 4 is greater than the capacitance between the channel region CR and the control gate CG of the 2D memory cell of FIG. 3. For example, the size of the 2D memory cell of FIG. 3 may be measured in a size of a planar area on which the 2D memory cell is formed on the body BD, and the size of the 3D memory cell of FIG. 4 may be measured in a size of a cylindrical area on which the 3D memory cell is formed on the vertical body BD_V.

Also, as illustrated in FIG. 2, in the 3D memory cell array, memory cells that correspond to two or more different string selection lines are connected to one word line. The whole capacitance of 3D memory cells corresponding to one word line corresponds to a sum of capacitances of memory cells corresponding to the two or more different string selection lines. In contrast, in the 2D memory cell array, memory cells that correspond to one string selection line are connected to one word line. The whole capacitance of 2D memory cells corresponding to one word line corresponds to a sum of capacitances of memory cells corresponding to the one string selection line. For example, assuming that the capacitance of the 2D memory cell is the same as the capacitance of the 3D memory cell, capacitance corresponding to one word line of the 3D memory cell array is greater than capacitance corresponding to one word line of the 2D memory cell array. However, as described above, since the capacitance of the 3D memory cell is greater than the capacitance of the 2D memory cell, capacitance corresponding to one word line of the 3D memory cell array may be much greater than capacitance corresponding to one word line of the 2D memory cell array.

To sum up, capacitance between a word line of the 3D memory cell array and vertical bodies BD_V of memory cells connected to the word line may be much greater than capacitance between one word line of the 2D memory cell array and bodies of memory cells connected to the word line. The capacitance may become greater as the degree of integration of the 3D memory cell array increases, and thus, the influence of coupling may increase more and more. The increase in capacitance and the increase in the influence of coupling may cause a decrease in reliability of the nonvolatile memory device 110 in the erase operation. Issues that occur due to an erase operation will be more fully described with reference to FIGS. 5 to 6.

In an embodiment, the vertical body BD_V may extend in a direction perpendicular to the substrate to make contact with the substrate. For example, if an erase voltage is supplied to the substrate, the erase voltage may be transferred through the vertical body BD_V. Below, to apply an erase voltage to the substrate may be interpreted substantially the same as the erase voltage is applied to the vertical bodies BD_V of memory cells. Likewise, to apply the erase voltage to the vertical bodies BD_V of the memory cells may be interpreted substantially the same as the erase voltage is applied to the substrate. Also, a substrate voltage may be interpreted substantially the same as a voltage of the vertical body BD_V, and the voltage of the vertical body BD_V may be interpreted substantially the same as the substrate voltage.

Figure 5:
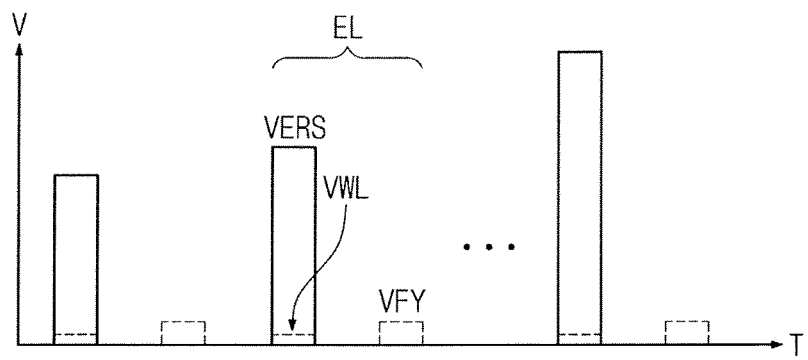
FIG. 5 illustrates an example in which the nonvolatile memory device performs an erase operation.

FIG. 5 illustrates an example in which the nonvolatile memory device 110 performs an erase operation. In FIG. 5, the abscissa represents a time T, and the ordinate represents a voltage V. In FIG. 5, a solid line represents a voltage applied to a substrate, and a dotted line represents a voltage applied to word lines of a memory block being selected as an erase target.

Referring to FIGS. 1 and 5, the erase operation may include a plurality of erase loops EL. Each erase loop EL may include an erase section in which an erase voltage VERS is applied to the substrate and a word line voltage VWL is applied to each word line of the selected memory block to be erased and an erase verification section in which a verification voltage VFY is applied to each word line of the selected memory block. For example, a word line voltage applied to each word line of the selected memory block upon erasing may be a positive voltage higher than a ground voltage.

Figure 6:
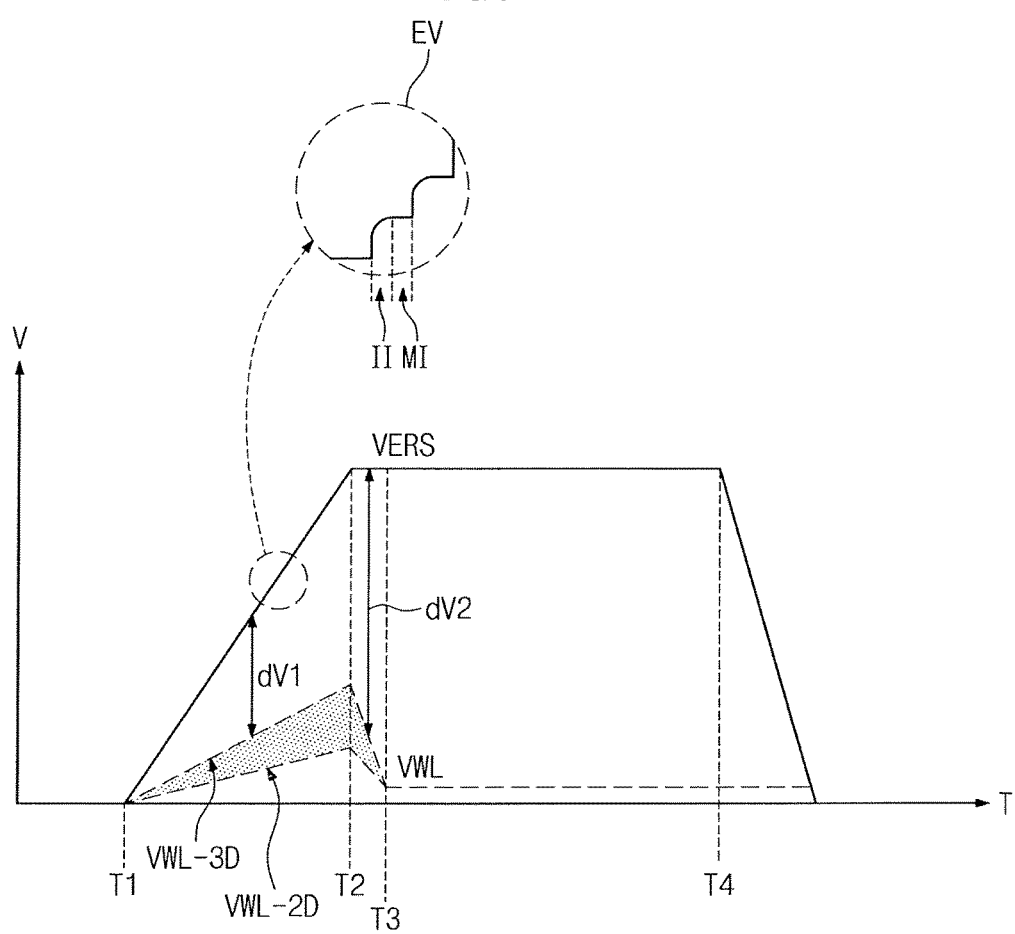
FIG. 6 illustrates an example in which an erase voltage and a word line voltage are applied in each erase loop.

FIG. 6 illustrates an example in which an erase voltage VERS and a word line voltage VWL are applied in each erase loop. In FIG. 6, the abscissa represents a time T, and the ordinate represents a voltage V. In FIG. 6, a solid line represents a voltage of the channel region CR of FIG. 3 or the vertical body BD_V of FIG. 4, and a dotted line represents a voltage of each word line. A word line voltage VWL-2D shows a variation in a word line voltage of the 2D memory cell array. A word line voltage VWL-3D shows a variation in a word line voltage of the 3D memory cell array.

At T1, the erase voltage VERS is applied to a substrate. A substrate voltage may gradually increase until it reaches the erase voltage VERS as a target voltage thereof. For example, referring to an enlarged view EV, the erase voltage VERS may rise to a target level in the form of a stair that has an increasing interval II and a maintaining interval MI. The erase voltage VERS may be applied to the channel region CR (refer to FIG. 3) of the 2D memory cell array or the vertical body BD_V of the 3D memory cell array. As the erase voltage VERS rises stepwise to the target level, a voltage of the channel region CR of the 2D memory cell array or a voltage of the vertical body BD_V of the 3D memory cell array may also rise stepwise to the target level. The voltage of the channel region CR or the vertical body BD may reach the target level at T2 and may maintain a target level until T4. At T4, a ground voltage (or a global ground voltage VSS) or a low voltage may be applied to the channel region CR or the vertical body BD, and a voltage of the channel region CR or the vertical body BD may be recovered to a voltage level before the erase voltage VERS is applied.

A word line voltage VWL-2D shows a variation in a word line voltage of the 2D memory cell array. For example, when a word line voltage VWL is applied to the word line, the word line voltage VWL-2D may rise, between T1 and T2, to a level higher than the word line voltage VWL applied to the word line due to the coupling between the word line and channel regions of memory cells connected to the word line. For example, the word line voltage VWL-2D may increase stepwise like the erase voltage VERS due to the coupling. In this case, the word line voltage VWL-2D may reach a peak word line voltage. At T2, when a voltage of the channel region CR reaches a target level of the erase voltage VERS and maintains the target level of the erase voltage VERS, a factor to increase the word line voltage VWL-2D disappears. For example, the coupling between the word line and channel regions of memory cells connected may disappear when the target level of the erase voltage VERS is maintained. Accordingly, after T2, the word line voltage VWL-2D may reach the word line voltage VWL, that is, the target level. For example, the word line voltage VWL-2D may be reduced from the peak word line voltage at T2 to VWL at T3. When a voltage of the channel region CR is recovered, the word line voltage VWL may also be recovered.

The reliability of erased memory cells becomes higher as the amount of charges discharged from floating gates of memory cells per unit time is lower, that is, charges are slowly discharged from the floating gates. To reduce the amount of charges discharged per unit time, as illustrated in the enlarged view EV, a scheme to perform a stepwise increase of a voltage of the channel region CR may be used in an erase operation. As a rising slope of the voltage of the channel region CR decreases, the intensity of an electric field applied to a memory cell may increase more slowly, and thus, the amount of charges discharged per unit time may decrease. For example, an interval between T1 and T3, in which a voltage difference between the control gate CG and the channel region CR of a memory cell, that is, the intensity of an electric field applied to the memory cell gradually increases and erasing is performed, may be a gradual erase interval. An interval between T3 and T4, in which a voltage difference between the control gate CG and the channel region CR of a memory cell, that is, the intensity of an electric field applied to the memory cell is fixed and erasing is performed, may be a fixed erase interval. In an exemplary embodiment, the erase section of FIG. 1 may include the gradual erase interval between T1 and T3 and the fixed erase interval between T3 and T4.

The effect to implement the gradual erase interval and the fixed erase interval by gradually increasing the erase voltage VERS need not be applied to memory cells of the 3D memory cell array.

A word line voltage VWL-3D shows a variation in a word line voltage of the 3D memory cell array. Even though the word line voltage VWL is applied to a word line, the word line voltage VWL-3D may rise to a level higher than the word line voltage VWL due to the coupling between the word line and channel regions of memory cells connected to the word line. For example, the coupling between a word line of the 3D memory cell array and vertical bodies BD_V of memory cells connected to the word line is greater than the coupling between a word line of the 2D memory cell array and channel regions CR of memory cells connected to the word line. Accordingly, the word line voltage VWL-3D may rise to be higher than the word line voltage VWL-2D.

In an interval between T1 and T2, as the second word line voltage VWL2 rises to a level higher than the first word line voltage VWL1, a voltage difference (dV1) between the vertical body BD_V and the vertical control gate CG_V may not be great enough to cause the Fowler-Nordheim (F-N) tunneling, which is an unintended phenomena due to the coupling and the 3D structure. For example, in the interval between T1 and T2, erasing may not be performed even though the intensity of an electric field applied to a memory cell gradually increases. In the 3D memory cell array, the interval between T1 and T2 may not act as the gradual erase interval as described above with respect to the 2D memory cell array.

At T2, if a voltage of the vertical body BD_V reaches a target level of the erase voltage VERS, a factor to increase the word line voltage VWL-3D disappears. Accordingly, the word line voltage VWL-3D may reach the word line voltage VWL, that is, the target level. In an interval between T2 and T3, a voltage difference (dV2) between the vertical body BD_V and the vertical control gate CG_V of a memory cell may gradually increases, thereby causing the F-N tunneling, that is, erasing. Accordingly, the interval between T2 and T3 may be the gradual erase interval of a memory cell in the 3D memory cell array. The interval between T3 and T4 may act as the fixed erase interval. In an exemplary embodiment, the erase section of FIG. 6 may include the gradual erase interval between T2 and T3 and the fixed erase interval between T3 and T4.

Figure 7:
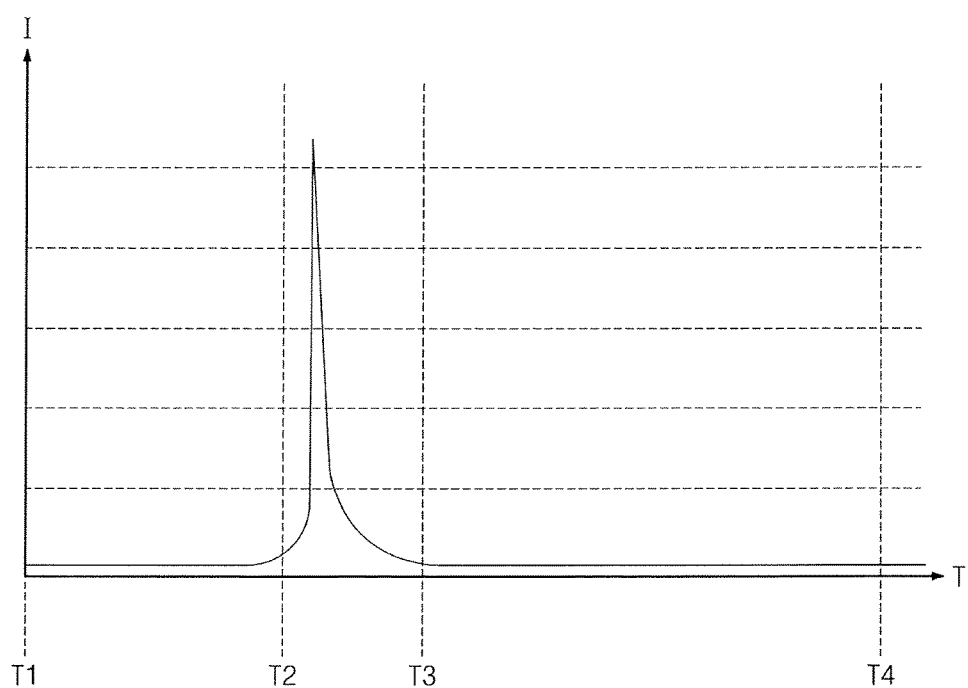
FIG. 7 illustrates the amount of charges discharged from in a memory cell of the 3D memory cell array.

FIG. 7 illustrates the amount of discharged charges in a memory cell of the 3D memory cell array. In FIG. 7, the abscissa represents a time T, and the ordinate represents a current I. Referring to FIGS. 6 to 7, the flow of charges may not occur between T1 and T2. For example, a memory cell in the 3D memory cell array may not be erased in the interval between T1 and T2. The flow of charges may occur in the interval between T2 and T3. In the 3D memory cell array, the interval between T2 and T3 may act as the gradual erase interval.

In the first word line voltage VWL1 of the 2D memory cell array, the gradual erase interval of a memory cell of the 2D memory cell array may be an interval between T1 and T3. In contrast, the gradual erase interval of a memory cell of the 3D memory cell array may be an interval between T2 and T3. The gradual erase interval of the 3D memory cell array may be shorter than the gradual erase interval of the 2D memory cell array. For example, the amount of discharged charges of the 3D memory cell array per unit time is greater than the amount of discharged charges of the 2D memory cell array per unit time. If voltages of the vertical body BD_V and the vertical control gate CG_V are controlled in the same method as voltages of the channel region CR and the control gate CG in the 2D memory cell array are controlled, the reliability of a memory cell of the 3D memory cell array may be lower than the reliability of a memory cell of the 2D memory cell array.

To solve the above-described issue, the nonvolatile memory device 110 may be configured or controlled to extend the gradual erase interval and to reduce the amount of charges discharged per unit time, upon erasing of a memory cell of the 3D memory cell array.

Figure 8:
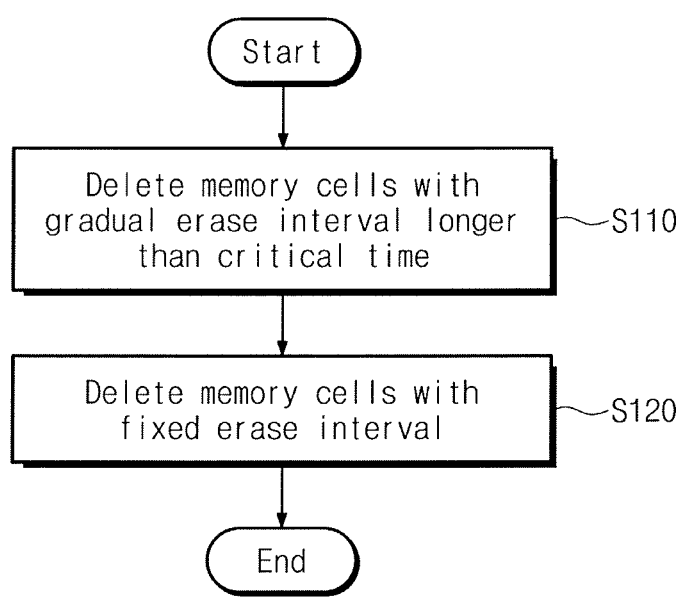
FIG. 8 is a flowchart illustrating an erasing method according to embodiments of the inventive concept.

FIG. 8 is a flowchart illustrating an erasing method according to embodiments of the inventive concept. Referring to FIGS. 1 and 8, in operation S110, the nonvolatile memory device 110 may erase memory cells of a selected memory block of the memory blocks BLK1 to BLKz with a gradual erase interval longer than a critical time. For example, the critical time may be set to a value of 0.5 ms or more such as 1 ms or 2 ms.

In operation S120, the nonvolatile memory device 110 may erase the memory cells of the selected memory block with the fixed erase interval.

The nonvolatile memory device 110 may make the gradual erase interval longer than the critical time, so the amount of charges discharged from memory cells of the selected memory block per unit time may be maintained to be lower than a threshold value. This means that the reliability of erased memory cells is increased.

Figure 9:
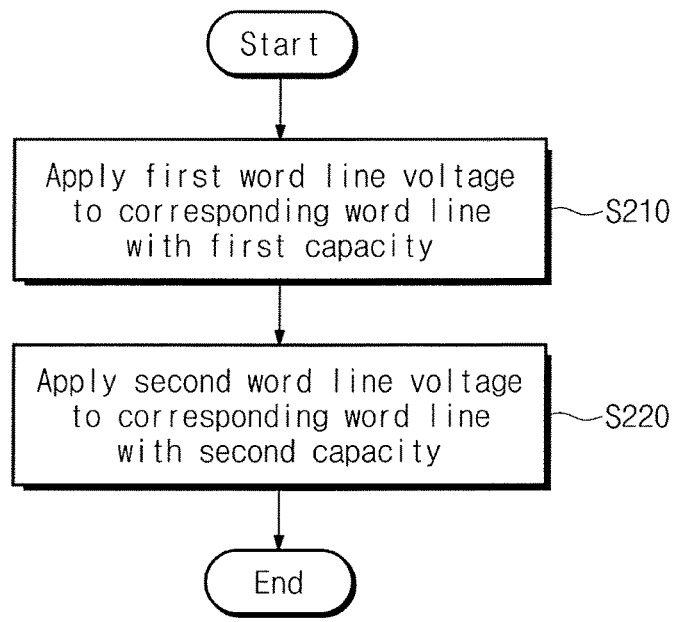
FIG. 9 is a flowchart illustrating an example of a method in which the nonvolatile memory device maintains a gradual erase interval to be longer than a critical time.

FIG. 9 is a flowchart illustrating an example of a method in which the nonvolatile memory device 110 maintains the gradual erase interval to be longer than the critical time. Referring to FIGS. 1, 2, and 9, in operation S210, the row decoder circuit 113 of the nonvolatile memory device 110 may apply a first word line voltage with a first capacity to a corresponding word line (or word lines) of a selected memory block.

In operation S220, the row decoder circuit 113 of the nonvolatile memory device 110 may apply a second word line voltage with a second capacity to a corresponding word line (or word lines) of the selected memory block.

The nonvolatile memory device 110 may maintain the gradual erase interval to be longer than the critical time by controlling the first capacity and the second capacity of the first word line voltage VWL1 and the second word line voltage VWL2 to be supplied to a word line (or word lines) of the selected memory block during an erase operation so as to be different from each other. For example, the first capacity and the second capacity may be different from each other. Each of the first capacity and the second capacity may be a capacity to supply a current.

Figure 10:
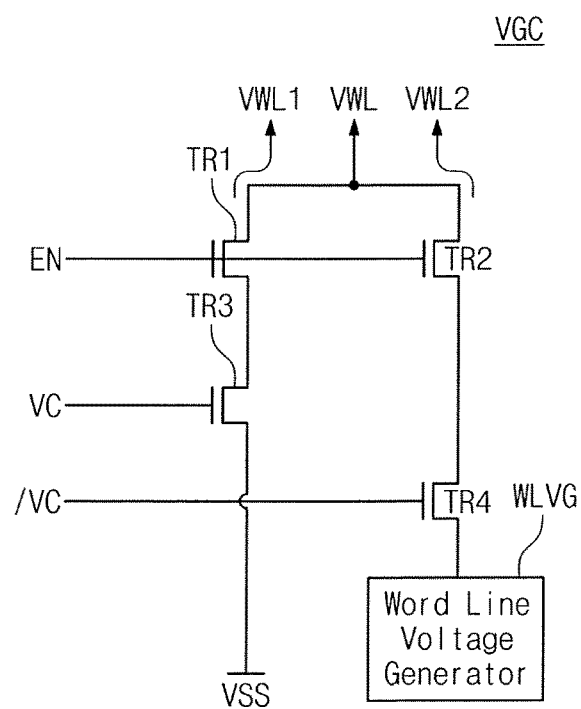
FIG. 10 illustrates an example of a voltage generation circuit.

FIG. 10 illustrates an example of the voltage generation circuit VGC. Referring to FIGS. 1 and 10, the voltage generation circuit VGC includes first, second, third, and fourth transistors TR1, TR2, TR3, and TR4 and a word line voltage generator WLVG.

The first and second transistors TR1 and TR2 may operate in response to an enable signal EN. The first and second transistors TR1 and TR2 may be turned on during an erase operation and may be turned off during other operations except the erase operation. The first and second transistors TR1 and TR2 may be turned off during other operations except the erase verification operation or the erase operation.

The third transistor TR3 and the fourth transistor TR4 may operate in response to a voltage control signal VC and an inverted voltage control signal /VC. The third and fourth transistors TR3 and TR4 may be complementary in operation. For example, when the third transistor TR3 is turned on, the fourth transistor TR4 may be turned off. In contrast, when the third transistor TR3 is turned off, the fourth transistor TR4 may be turned on.

During an erase operation, the fourth transistor TR4 may be turned on after the third transistor TR3 is turned on. For example, the third transistor TR is first turned on in response to the voltage control signal VC, and then the fourth transistor TR is turned on in response to the inverted voltage control signal /VC. If the third transistor TR3 is turned on, the third transistor TR3 may transfer the global ground voltage VSS supplied from the outside of the nonvolatile memory device 110. In this case, the voltage generation circuit VGC may output a first word line voltage VWL1 at a first capacity. If the fourth transistor TR4 is turned on, the fourth transistor TR4 may transfer a second word line voltage VWL2 generated by the word line voltage generator WLVG. For example, the voltage generation circuit may output the second word line voltage VWL2 at a second capacity. For example, when the third transistor TR3 is turned on, the global ground voltage VSS supplied from the outside may be output as the word line voltage VWL. In this case, the global ground voltage VSS correspond to the first word line voltage VWL1. When the fourth transistor TR4 is turned on, a voltage that is generated by the word line voltage generator WLVG in the nonvolatile memory device 110 may be output as the second word line voltage VWL2. In an exemplary embodiment, the global ground voltage VSS supplied from the outside is generated at the first capacity greater than the second capacity at which a voltage is generated by the word line voltage generator WLVG.

Figure 11:
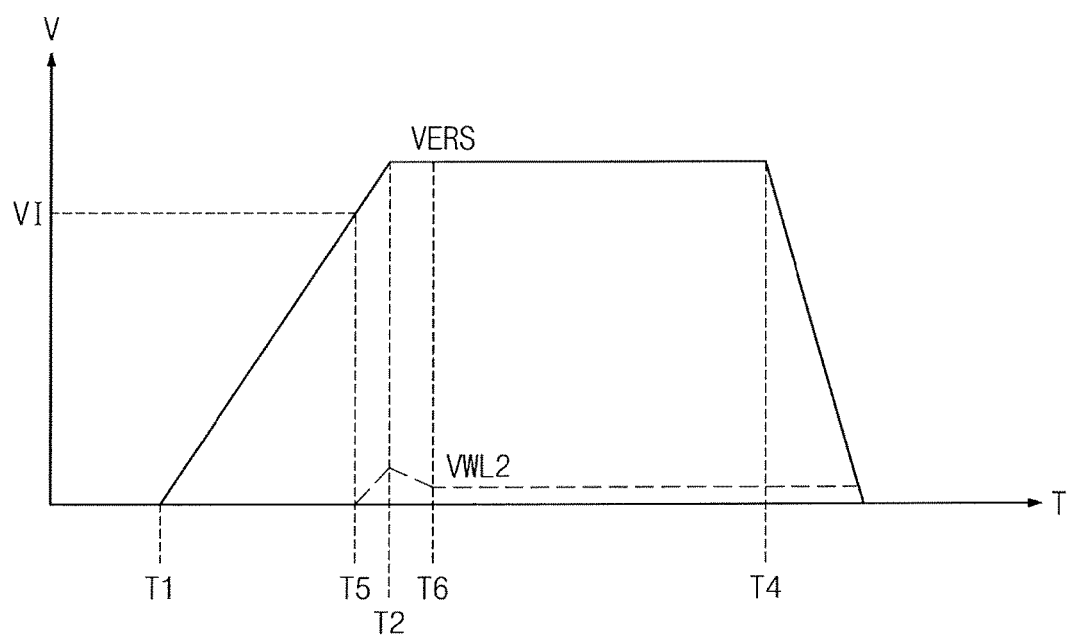
FIG. 11 illustrates an example in which an erase operation is performed by using a word line voltage generated by the voltage generation circuit of FIG. 10.

FIG. 11 illustrates an example in which an erase operation is performed by using the word line voltage VWL generated by the voltage generation circuit VGC of FIG. 10. In FIG. 11, the abscissa represents a time T, and the ordinate represents a voltage V. In FIG. 11, a solid line represents a voltage of a substrate or the vertical body BD_V, and a dotted line represents a voltage of a word line or the vertical control gate CG_V.

Referring to FIGS. 1, 2, and 11, the erase voltage VERS is applied to the vertical body BD_V at T1. A voltage of the vertical body BD_V starts to rise to a target level of the erase voltage VERS. As described with reference to FIG. 6, a voltage of the vertical body BD_V may gradually increase stepwise.

At T1, the first word line voltage VWL1 is applied to a word line (or word lines). For example, the voltage generation circuit VGC may output the global ground voltage VSS as the word line voltage VWL. The row decoder circuit 113 may apply the global ground voltage VSS to a word line (or word lines) of a selected memory block. Since a capacity of the global ground voltage VSS is greater than capacities of voltages generated in the interior of the nonvolatile memory device 110, a voltage of a word line may be maintained at a level of the global ground voltage VSS. Accordingly, a voltage difference between the voltages of the substrate and the word line gradually increases, and the interval between T1 and T5 may be included in the gradual erase interval.

At T5 before a voltage of the vertical body BD_V reaches a target level or at T5 when a voltage of the vertical body BD_V (or a voltage of the substrate) reaches an intermediate level VI lower than the target level, the second word line voltage VWL2 is applied to a word line (or word lines). For example, the voltage generation circuit VGC may output a positive voltage generated by the word line voltage generator WLVG as the word line voltage VWL. The row decoder circuit 113 may apply the positive voltage to a word line (or word lines) of the selected memory block.

Since a capacity of the second word line voltage VWL2 is smaller than a capacity of the first word line voltage VWL1, a voltage of a word line may increase due to the coupling. For example, a voltage of a word line may rise to a level higher than a target level of the second word line voltage VWL2. The time interval between T5 and T2, in which both a voltage of the vertical body BD_V and a voltage of a word line increase, may be also included in the gradual erase interval.

At T2, a voltage of the vertical body BD_V reaches a target level of the erase voltage VERS. Since the factor to increase a word line voltage disappears, a voltage of a word line may be reduced to a target level of the second word line voltage VWL2. For example, at T6, a voltage of a word line may reach a target level of the second word line voltage VWL2. The interval between T2 and T6, in which a voltage of the vertical body BD_V is fixed and a voltage of a word line decrease, may be also included in the gradual erase interval.

In an exemplary embodiment, the erase voltage may include a transient voltage and a target voltage. The transient voltage is applied in a first interval between T1 and T2 and the target voltage is maintained in a second interval between T2 and T4. The transient voltage of the erase voltage VERS increases to the target voltage.

As described above, the nonvolatile memory device 110 may apply a positive voltage with a small capacity after applying the global ground voltage VSS with a great capacity to the vertical body BD_V, and thus it may use an interval between T2 and T6 as the gradual erase interval.

Figure 12:
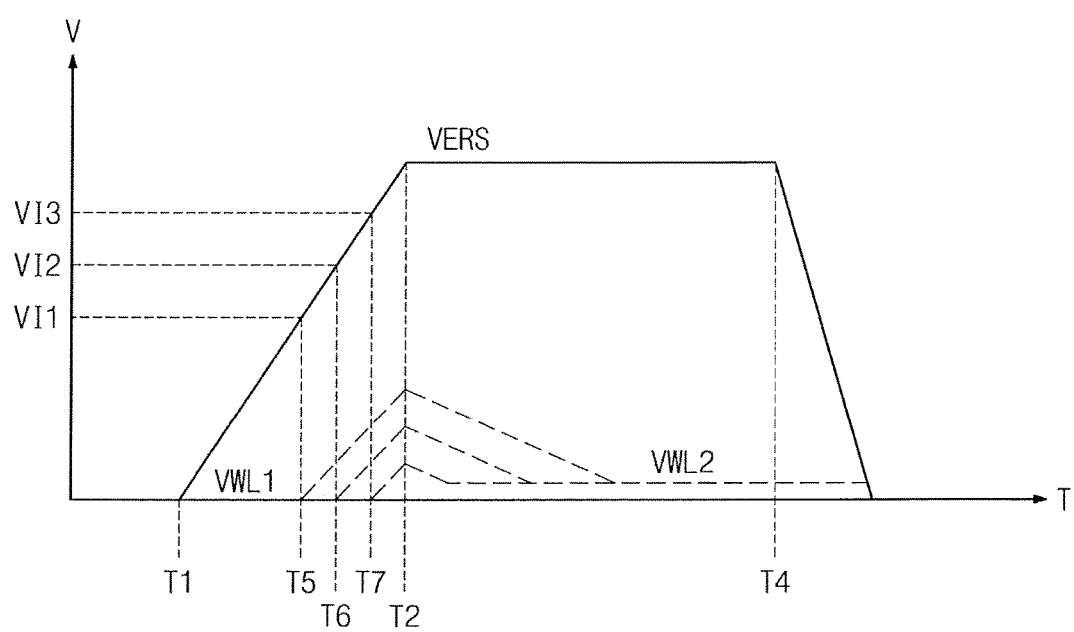
FIG. 12 illustrates an example in which time points when a second word line voltage is applied are changed.

FIG. 12 illustrates an example in which time points when the second word line voltage VWL2 is applied are changed. In FIG. 12, the abscissa represents a time T, and the ordinate represents a voltage V. Unlike the description given with reference to FIG. 11, one of T5, T6, and T7 may be selected as a time point when the second word line voltage VWL2 is applied. As another example, the condition that the second word line voltage VWL2 is applied may be determined based on whether a voltage of the vertical body BD_V (or a voltage of the substrate) reaches one of an intermediate voltage VI1, a second intermediate voltage VI2, and a third intermediate voltage VI3, which are lower than a target level of the erase voltage VERS. The amount of charges discharged per unit time during an erase operation may be finely adjusted by adjusting the timing when the second word line voltage VWL2 is applied.

Figure 13:
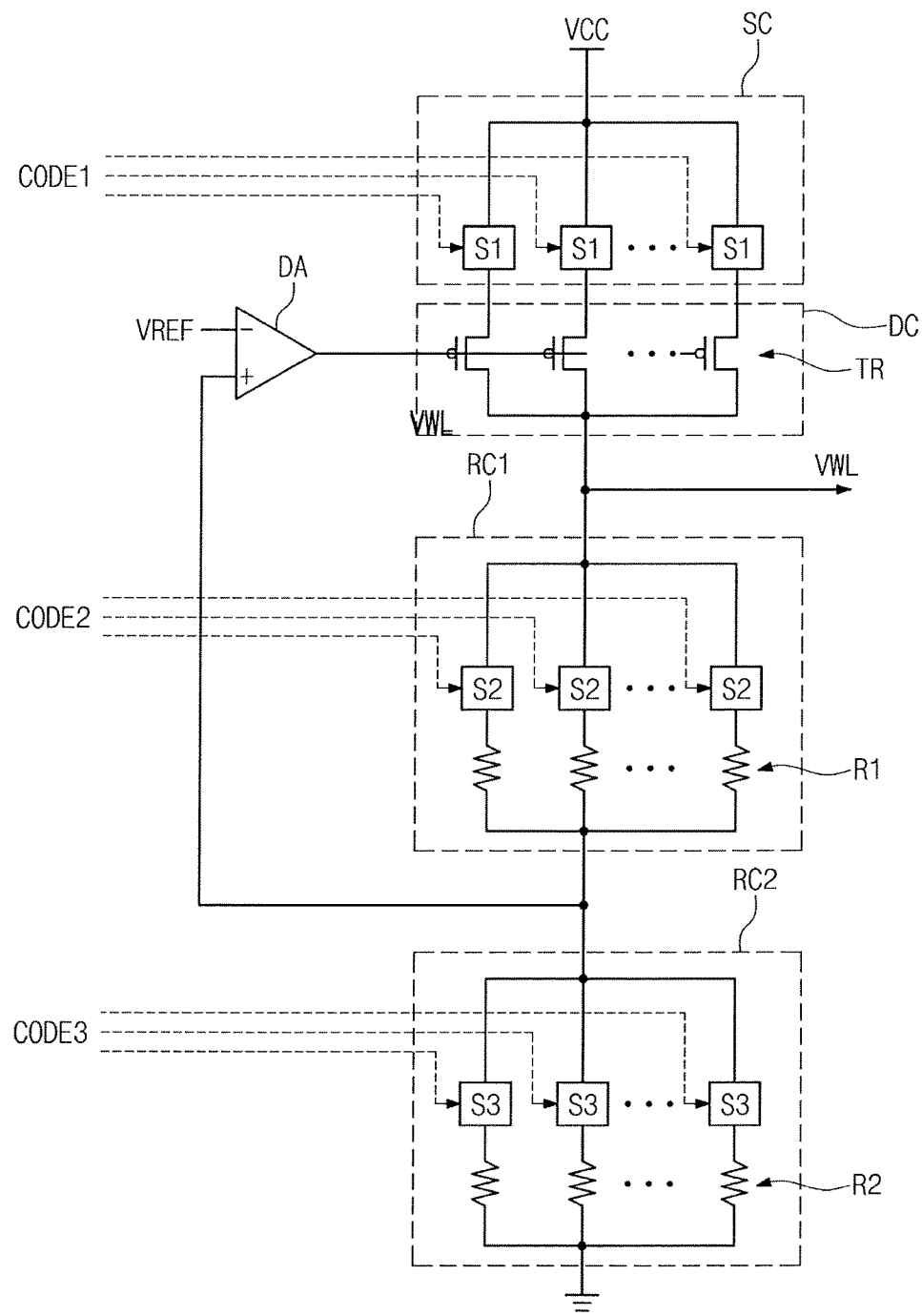
FIG. 13 illustrates another example of the voltage generation circuit.

FIG. 13 illustrates an example of the voltage generation circuit VGC. Referring to FIGS. 1 and 13, the voltage generation circuit VGC includes a differential amplifier DA, a switch circuit SC, a driver circuit DC, a first resistor circuit RC1, and a second resistor circuit RC2.

The power supply voltage VCC may be supplied to the first resistor circuit RC1 through the switch circuit SC and the driver circuit DC. The first resistor circuit RC1 and the second resistor circuit RC2 may divide a voltage supplied through the switch circuit SC and the driver circuit DC. The differential amplifier DA may compare the divided voltage with a reference voltage VREF and may control the driver circuit DC based on the comparison result. A voltage of a node between the driver circuit DC and the first resistor circuit RC1 may be output as the word line voltage VWL.

For example, if the divided voltage is higher than the reference voltage VREF, the differential amplifier DA may decrease a capacity (a current amount) of the driver circuit DC. If the capacity of the driver circuit DC decreases, the word line voltage VWL may decrease, and thus the divided voltage may also decrease. If the divided voltage is lower than the reference voltage VREF, the differential amplifier DA may increase a capacity (a current amount) of the driver circuit DC. If the capacity of the driver circuit DC increases, the word line voltage VWL may increase, and thus the divided voltage may also increase. For example, the voltage generation circuit VGC may adjust the word line voltage VWL such that the divided voltage follows the reference voltage VREF. The capacity of the driver circuit DC may be referred to as a current driving capacity of the driver circuit DC.

The driver circuit DC includes a plurality of transistors TR. The switch circuit SC includes a plurality of first switches S1. One of the first switches S1 may be serially connected to a corresponding one of the transistors TR. The transistors TR may be connected in parallel between a node to which the power supply voltage VCC is supplied and a node from which the word line voltage VWL is output. The number of transistors, which are activated, from among the transistors TR connected in parallel with each other, that is, the number of transistors TR used to adjust a capacity of the driver circuit DC under control of the differential amplifier DA may be adjusted by the first switches S1.

For example, if a first switch S1 is turned on, a transistor TR corresponding thereto may adjust a capacity of the driver circuit DC under control of the differential amplifier DA. If the first switch S1 is turned off, the transistor TR corresponding thereto need not affect the capacity of the driver circuit DC regardless of control of the differential amplifier DA. For example, a maximum capacity of the driver circuit DC may vary according to a first code CODE1 for controlling the first switches S1.

The first resistor circuit RC1 includes a plurality of first resistors R1 and a plurality of second switches S2. Like the description given with reference to the switch circuit SC and the driver circuit DC, the second switches S2 may determine kinds or the number of resistors, which will be selected to divide a voltage, from among the first resistors R1. If the kinds or the number of resistors to be selected is adjusted, a total of resistance value of the first resistor circuit RC1 may be adjusted.

The second resistor circuit RC2 includes a plurality of second resistors R2 and a plurality of third switches S3. Like the description given with reference to the switch circuit SC and the driver circuit DC, the third switches S3 may determine kinds or the number of resistors, which will be selected to divide a voltage, from among the second resistors R2. If the kinds or the number of resistors to be selected is adjusted, a total of resistance value of the second resistor circuit RC2 may be adjusted.

For example, a capacity of the voltage generation circuit VGC may vary according to a second code CODE2 for controlling the second switches S2 and a third code CODE3 for controlling the third switches S3. For example, if a ratio of a resistance value of the first resistor circuit RC1 to a resistance value of the second resistor circuit RC2 is maintained, a target level of the word line voltage VWL may be also maintained. If a ratio of a resistance value of the first resistor circuit RC1 to a resistance value of the second resistor circuit RC2 is changed, a target level of the word line voltage VWL may be also changed. If a total of resistance value of the first and second resistor circuits RC1 and RC2 increases, the amount of current flowing through the first and second resistor circuits RC1 and RC2 may decrease, and thus a capacity of the voltage generation circuit VGC may increase. If a total of resistance value of the first and second resistor circuits RC1 and RC2 decreases, a capacity of the voltage generation circuit VGC may decrease.

Figure 14:
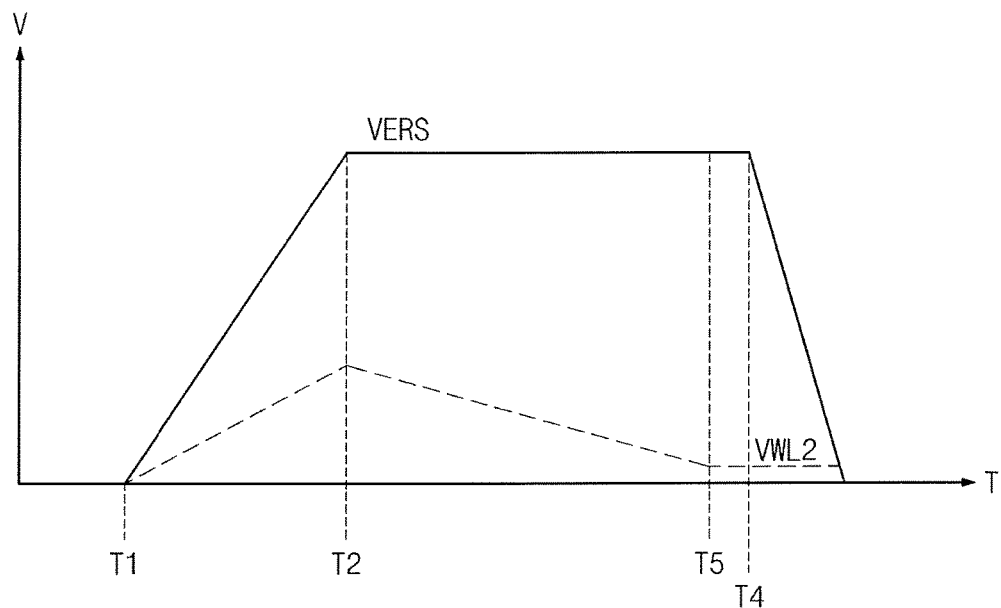
FIG. 14 illustrates an example in which an erase operation is performed by using a word line voltage generated by the voltage generation circuit of FIG. 13.

FIG. 14 illustrates an example in which an erase operation is performed by using the word line voltage VWL generated by the voltage generation circuit VGC of FIG. 13. In FIG. 14, the abscissa represents a time T, and the ordinate represents a voltage V. In FIG. 14, a solid line represents a voltage of a substrate or the vertical body BD_V, and a dotted line represents a voltage of a word line or the vertical control gate CG_V.

Referring to FIGS. 1, 2, and 14, the erase voltage VERS is applied to the vertical body BD_V at T1. A voltage of the vertical body BD_V starts to rise to a target level of the erase voltage VERS. As described with reference to FIG. 6, a voltage of the vertical body BD_V may gradually increase stepwise. As an example, a voltage of the vertical body BD_V continues to increase until it reaches a target level of the erase voltage VERS. For example, a target voltage of the erase voltage VERS is applied to the substrate or the vertical body BD_V at T1, and a voltage of the substrate or the vertical body BD_V may rise up to a target level of the erase voltage VERS at T2.

At T1, the first word line voltage VWL1 is applied to a word line (or word lines). For example, the voltage generation circuit VGC may control the first to third codes CODE1 to CODE3 such that the first word line voltage VWL1 having a first capacity is output.

As described with reference to FIG. 6, since a voltage of a word line rises in an interval between T1 and T2 due to the coupling, an erase operation need not be performed.

At T2, if a voltage of the vertical body BD_V reaches a target level of the erase voltage VERS, a factor to increase a voltage of the word line disappears. Accordingly, a voltage of the word line starts to decrease.

The voltage generation circuit VGC may output the second word line voltage VWL2 having a second capacity at T2. The second capacity may be smaller than the first capacity. Accordingly, a time period in which a voltage of the word line decreases to a target level of the second word line voltage VWL2 may be longer than a time period described with reference to FIG. 6. For example, a voltage of the word line may decrease during an interval between T2 and T5. If a time period in which a voltage of the word line decreases to a target level increases, the amount of charges discharged per unit time decreases. Accordingly, the interval between T2 and T5 may be included in the gradual erase interval.

In an embodiment, a target level of the first word line voltage VWL1 may be the same as a target level of the second word line voltage VWL2. For example, the nonvolatile memory device 110 may adjust a capacity while maintaining a target level of the word line voltage VWL during an erase operation. As an example, target levels of the first word line voltage VWL1 and the second word line voltage VWL2 may be set to be different from each other. For example, a target level of the first word line voltage VWL1 may be higher or lower than a target level of the second word line voltage VWL2.

Figure 15:
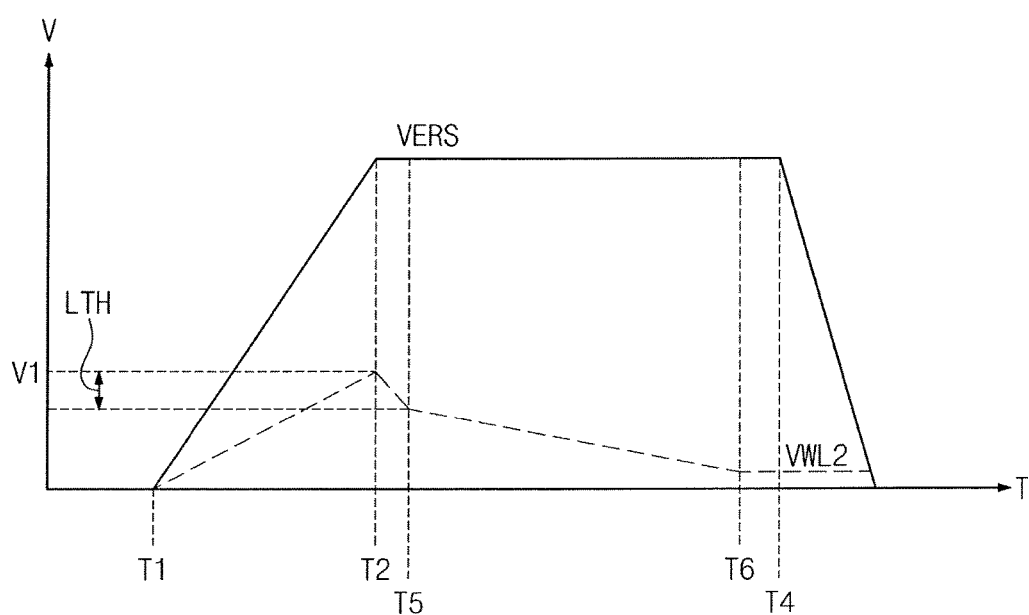
FIG. 15 illustrates an example in which a timing when the second word line voltage is applied is changed.

FIG. 15 illustrates an example in which a timing when the second word line voltage VWL2 is applied is changed. In FIG. 15, the abscissa represents a time T, and the ordinate represents a voltage V. Unlike the description given with reference to FIG. 14, the voltage generation circuit VGC may output the second word line voltage VWL2 at T5 after a voltage of the vertical body BD_V reaches a target level of the erase voltage VERS.

The voltage generation circuit VGC may output the first word line voltage VWL1 having a first capacity in an interval between T2, at which a voltage of the vertical body BD_V reaches a target level of the erase voltage VERS, and T5. Accordingly, as described with reference to FIG. 6, a slope in which a voltage of a word line decreases in an interval between T2 and T5 may be greater than a slope in which a voltage of the word line decreases in an interval between T5 and T6.

In an embodiment, if the second word line voltage VWL2 having the second capacity is applied at T2 as described with reference to FIG. 14, the F-N tunneling need not be performed immediately due to the physical characteristics of memory cells. For example, the F-N tunneling may be generated after a voltage of the word line decreases by a threshold level LTH from a level V1 corresponding to T2. In this case, as described with reference to FIG. 15, a start time point of gradual erasing may become faster by decreasing a voltage of a word line by using the first word line voltage VWL1 having the first capacity after T2, and thus an erase time may decrease.

Figure 16:
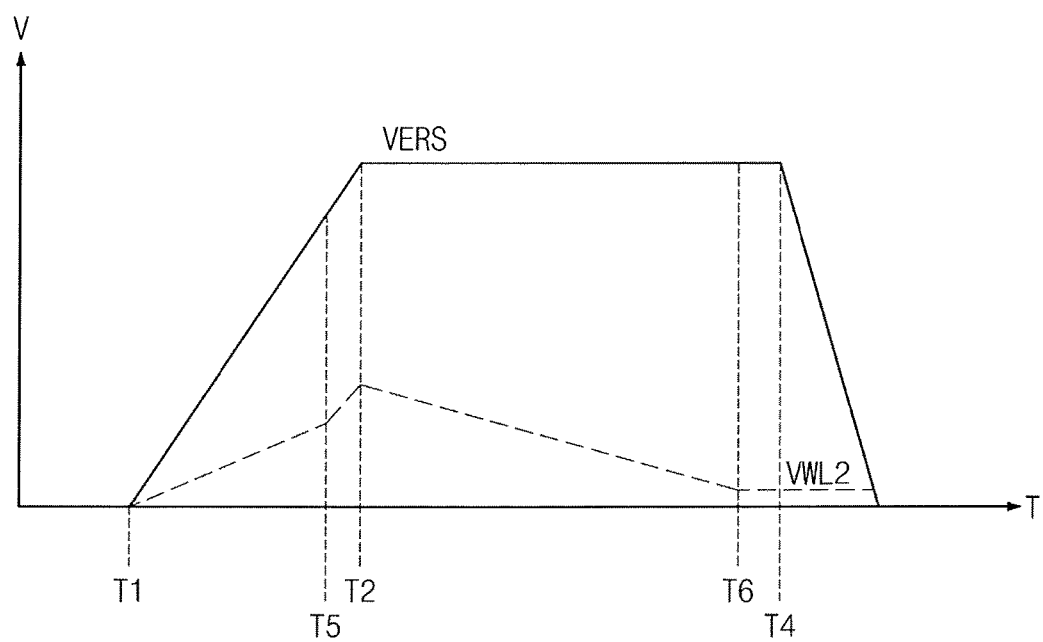
FIG. 16 illustrates another example in which a timing when the second word line voltage is applied is changed.

FIG. 16 illustrates an example in which a timing when the second word line voltage VWL2 is applied is changed. In FIG. 16, the abscissa represents a time T, and the ordinate represents a voltage V. Unlike the description given with reference to FIG. 14, the voltage generation circuit VGC may output the second word line voltage VWL2 at T5 before a voltage of the vertical body BD_V reaches a target level of the erase voltage VERS.

The second capacity of the second word line voltage VWL2 may be smaller than the first capacity of the first word line voltage VWL1. Accordingly, a rising slope of a voltage of a word line increases at T5 when the second word line voltage VWL2 is applied.

If a voltage of the vertical body BD_V reaches a target level of the erase voltage VERS at T2, a voltage of the word line starts to decrease.

Unlike the description given with reference to FIG. 14, the gradual erase interval may increase by applying the second word line voltage VWL2 before a voltage of the vertical body BD_V reaches a target level of the erase voltage VERS. As the gradual erase interval increases, the reliability of erased memory cells may be further increased.

A description is given with reference to FIGS. 14 to 16 as a word line voltage or a capacity of a word line voltage is adjusted at one time. However, a word line voltage or a capacity of a word line voltage may be adjusted two times or more.

Figure 17:
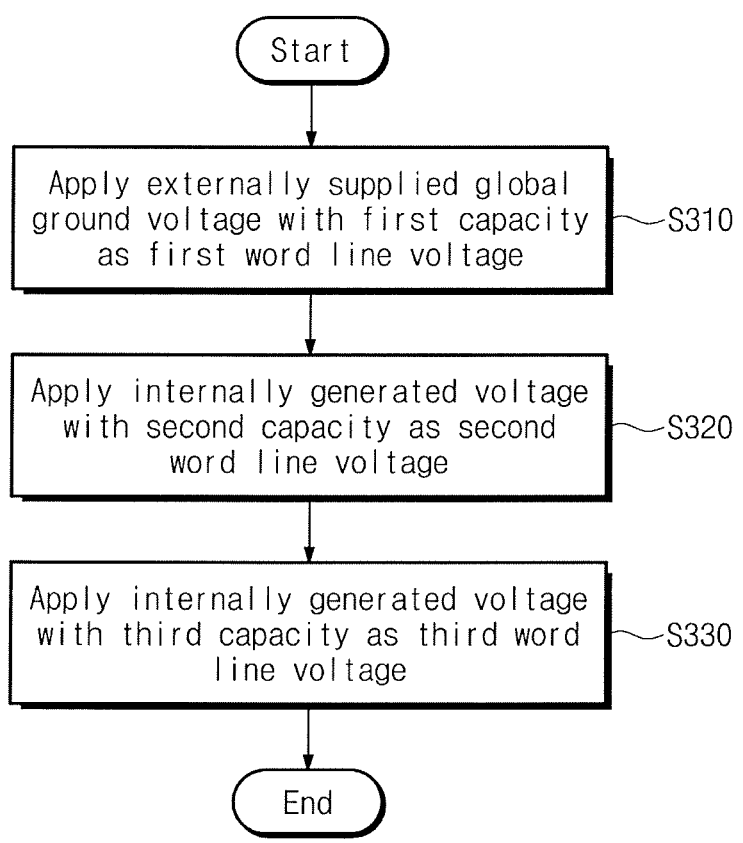
FIG. 17 illustrates an example in which an example described with reference to FIG. 11 and an example described with reference to FIG. 14 are combined.

FIG. 17 illustrates an example in which an example described with reference to FIG. 11 and an example described with reference to FIG. 14 are combined. Referring to FIGS. 1 and 17, in operation S310, an externally supplied global ground voltage VSS having the first capacity may be applied to a word line (or word lines) of a selected memory block as a first word line voltage.

In operation S320, an internally generated voltage having the second capacity may be applied to the word line (or the word lines) of the selected memory block as a second word line voltage. The second capacity may be smaller than the first capacity. The second word line voltage may be a positive voltage.

In operation S330, an internally generated voltage having a third capacity may be applied to the word line (or the word lines) of the selected memory block as a third word line voltage. The third capacity may be smaller than the second capacity. The third word line voltage may be a positive voltage. The third word line voltage may be the same as or different from the second word line voltage.

Figure 18:
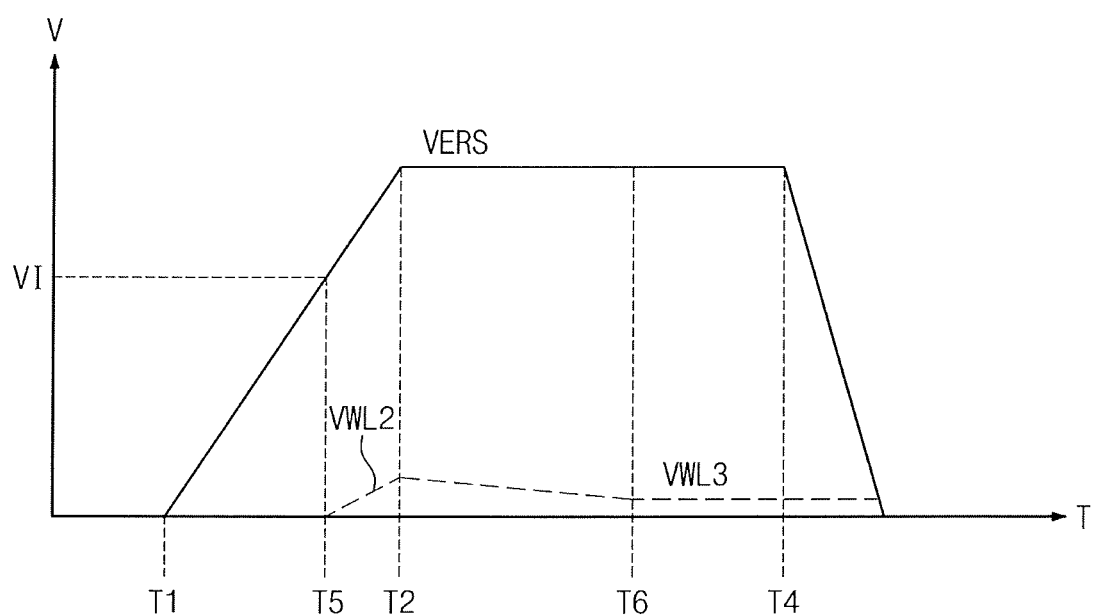
FIG. 18 illustrates a process in which an erase operation is performed according to the method of FIG. 17.

FIG. 18 illustrates a process in which an erase operation is performed according to the method of FIG. 17. In FIG. 18, the abscissa represents a time T, and the ordinate represents a voltage V. Referring to FIGS. 1 and 18, the erase voltage VERS is applied to the vertical body BD_V at T1. As the erase voltage VERS rises to a target level thereof, a voltage of the vertical body BD_V may also rise to the target level of the erase voltage VERS. For example, as described with reference to FIG. 6, a voltage of the vertical body BD_V may gradually stepwise increase.

At T1, the global ground voltage VSS may be applied to a word line (or word lines) as the first word line voltage VWL1. Since the first capacity of the global ground voltage VSS is relatively great, a voltage of the word line may be maintained at a level of the ground voltage VSS.

Before a voltage of the vertical body BD_V reaches a target level of the erase voltage VERS, at T5, or when a voltage of the vertical body BD_V reaches the intermediate level VI, the second word line voltage VWL2 having the second capacity may be applied to a word line (or word lines). As the second word line voltage VWL2 is applied to the word line (or word lines), as described with reference to FIGS. 11 and 14, a voltage of the word line may increase due to the coupling.

At T2, a voltage of the vertical body BD_V reaches a target level of the erase voltage VERS. Since the factor to increase a voltage of the word line disappears, the voltage of the word line starts to decrease. In this case, as described with reference to FIG. 14, a third word line voltage VWL3 having the third capacity may be applied to the word line (or word lines). Since the third capacity is smaller than the second capacity, as described with reference to FIG. 14, a voltage of the word line may decrease with a relatively small slope. At T6, a voltage of the word line may reach a target level of the third word line voltage VWL3.

As described with reference to FIG. 18, if a voltage to be applied to a word line is adjusted, an interval between T1 and T6 may be included in the gradual erase interval.

In an embodiment, as described with reference to FIG. 12, a timing when the second word line voltage VWL2 is applied to the word line (or word lines) may be changed.

Also, as described with reference to FIGS. 15 and 16, a timing when the third word line voltage VWL3 is applied to the word line (or word lines) may be changed.

Figure 19:
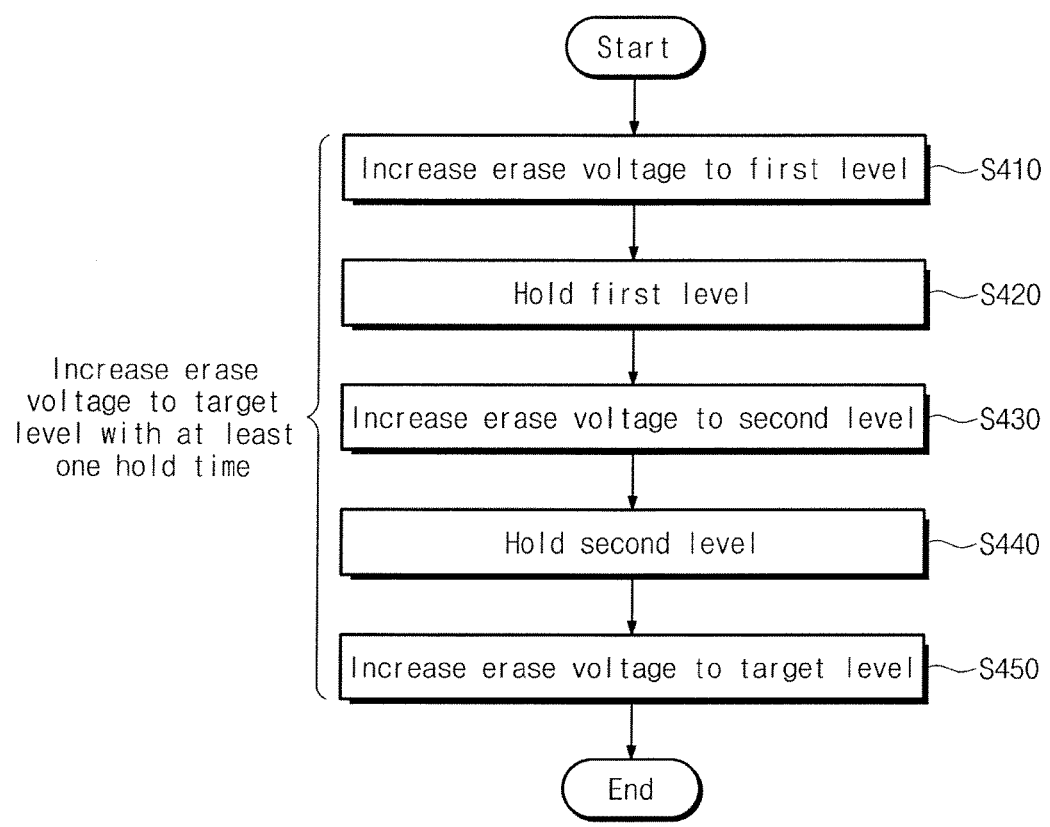
FIG. 19 is a flowchart illustrating another example of a method in which the nonvolatile memory device maintains the gradual erase interval to be longer than the critical time.

FIG. 19 is a flowchart illustrating an example of a method in which the nonvolatile memory device 110 maintains the gradual erase interval to be longer than the critical time. Referring to FIGS. 1 and 19, the nonvolatile memory device 110 may maintain the gradual erase interval to be longer than the critical time by increasing an erase voltage to a target level with at least one hold time.

For example, in operation S410, the voltage generation circuit VGC may increase the erase voltage VERS to a first level that is lower than a target level thereof. In operation S420, the voltage generation circuit VGC may hold the first level during a hold time period.

In operation S430, the voltage generation circuit VGC may increase the erase voltage VERS to a second level that is lower than the target level thereof and is higher than the first level. In operation S440, the voltage generation circuit VGC may hold the second level during a hold time period.

In operation S450, the voltage generation circuit VGC may increase the erase voltage VERS to the target level thereof.

Figure 20:
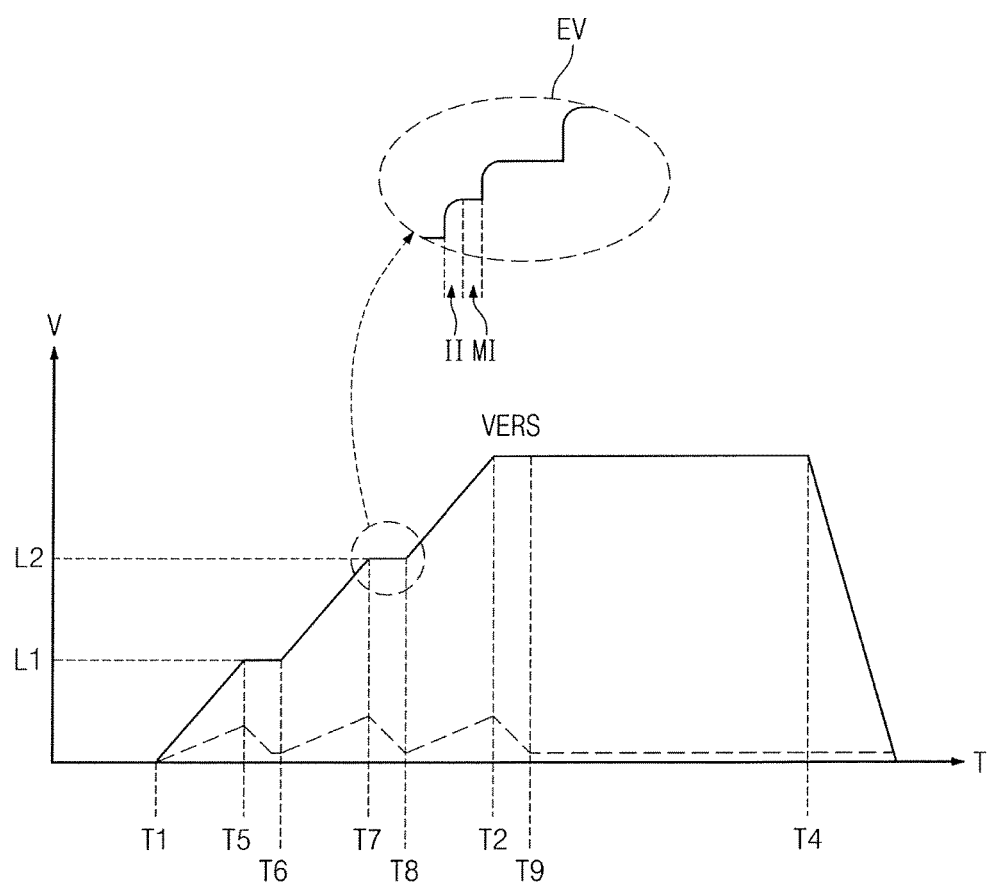
FIG. 20 illustrates a process in which an erase operation is performed according to the method of FIG. 19.

FIG. 20 illustrates a process in which an erase operation is performed according to the method of FIG. 19. In FIG. 20, the abscissa represents a time T, and the ordinate represents a voltage V. In FIG. 20, a solid line represents a voltage of a substrate or the vertical body BD_V, and a dotted line represents a voltage of a word line (or word lines).

Referring to FIGS. 1 and 20, the erase voltage VERS may start to increase at T1. For example, as described with reference to FIG. 6, the erase voltage VERS may gradually increase stepwise. As the erase voltage VERS increases, a voltage of the substrate or the vertical body BD_V may also gradually increase. A voltage of the substrate or the vertical body BD_V may increase up to a first level L1 that is lower than a target level of the erase voltage VERS at T2.

At T1, the word line voltage VWL is applied to a word line (or word lines) of a selected memory block. The word line voltage VWL may be a positive voltage. As described with reference to FIG. 6, since a voltage of the substrate or the vertical body BD_V increases in an interval between T1 and T5, a voltage of the word line (or word lines) may also increase due to the coupling. For example, a voltage of the word line (or word lines) may rise to a level that is higher than a target level of the word line voltage VWL.

A voltage of the substrate or the vertical body BD_V is maintained at the first level L1 in the interval between T5 and T6. The interval between T5 and T6 may be a hold time period. The hold time period may be greater than an interval in which a voltage of the substrate or the vertical body BD_V increases step by step, for example, an interval MI in which the interval between T1 and T5 is maintained. Since a voltage of the substrate or the vertical body BD_V is maintained at the first level L1 during the hold time period, the factor to increase a voltage of a word line disappears. Accordingly, a voltage of the word line may decrease to a target level of the word line voltage VWL in the interval between T5 and T6.

At T6, a voltage of the substrate or the vertical body BD_V may rise from the first level L1. At T7, a voltage of the substrate or the vertical body BD_V may reach a second level L2 that is higher than the first level L1 and lower than the target level thereof. A voltage of the word line may increase due to the coupling in an interval between T6 and T7.

The interval between T7 and T8 may be a hold time period. During the hold time period, a voltage of the substrate or the vertical body BD_V may be maintained at the second level L2. A voltage of the word line may decrease to a target level of the word line voltage VWL.

During the interval between T8 and T2, a voltage of the substrate or the vertical body BD_V may rise to the target level of the erase voltage VERS. A voltage of the word line may increase due to the coupling.

Since a voltage of the vertical body BD_V reaches a target level of the erase voltage VERS at T2, the factor to increase a voltage of the word line disappears. Accordingly, a voltage of the word line may decrease to a target level of the word line voltage VWL.

The voltage generation circuit VGC may provide at least one hold time period in an interval in which the erase voltage VERS increases. Accordingly, at least one hold time period may be provided in an interval in which a voltage of the substrate or the vertical body BD_V increases. During the at least one hold time period, a voltage of the word line may decrease to the target level of the word line voltage VWL.

If a difference between a voltage of the substrate or the vertical body BD_V and a voltage of the word line is secured enough to generate the F-N tunneling, the gradual erase interval may be secured. In an embodiment, the interval between T5 and T9 or the interval between T6 and T9 may be included in the gradual erase interval.

Figure 21:
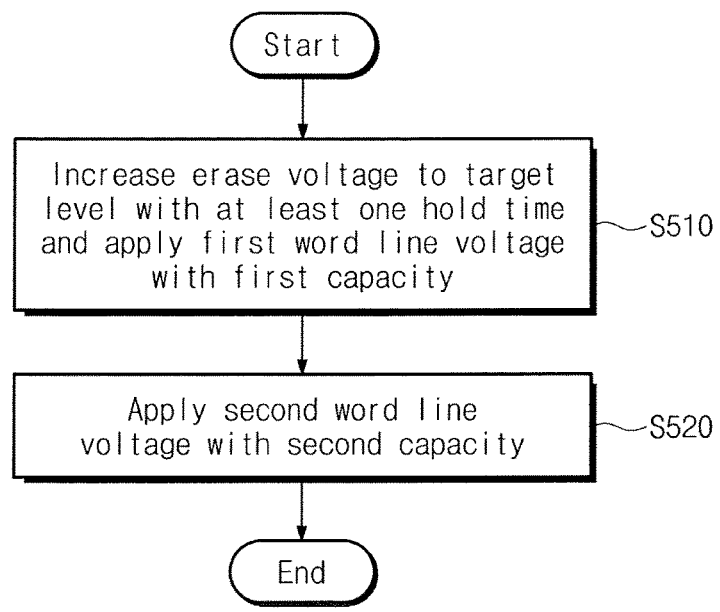
FIG. 21 illustrates an example in which the method of FIG. 14 and the method of FIG. 20 are combined.

FIG. 21 illustrates an example in which the method of FIG. 14 and the method of FIG. 20 are combined. Referring to FIGS. 1 and 21, in operation S510, an erase voltage rises to a target level with at least one hold time period, and a first word line voltage having the first capacity is applied to a word line (or word lines) of a selected memory block.

In operation S520, a second word line voltage having the second capacity is applied to the word line (or word lines) of the selected memory block.

Figure 22:
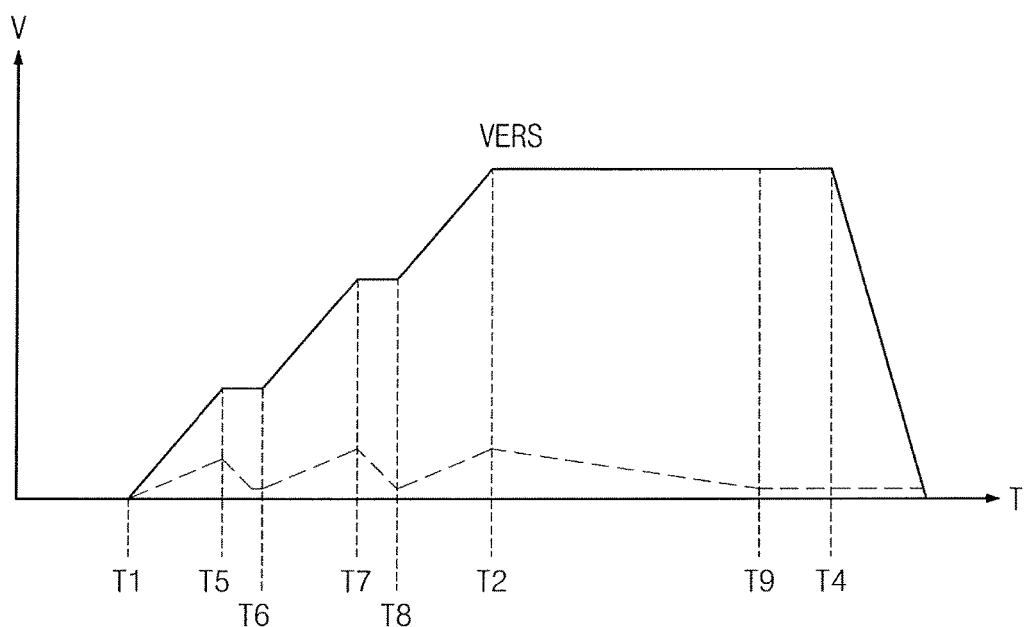
FIG. 22 illustrates a process in which an erase operation is performed according to the method of FIG. 21.

FIG. 22 illustrates a process in which an erase operation is performed according to the method of FIG. 21. In FIG. 22, the abscissa represents a time T, and the ordinate represents a voltage V. In FIG. 22, a solid line represents a voltage of a substrate or the vertical body BD_V, and a dotted line represents a voltage of a word line (or word lines).

An interval between T1 and T2, which includes T5 to T8, may be substantially the same as an interval between T1 and T2 described with reference to FIG. 20. For example, the voltage generation circuit VGC may output a first word line voltage having the first capacity in an interval between T1 and T2. As described with reference to FIG. 20, a voltage of the substrate or the vertical body BD_V may rise to a target level of the erase voltage VERS with at least one hold time period. During the at least one hold time period, a voltage of the word line (or word lines) may decrease to a target level of the first word line voltage.

If a voltage of the vertical body BD_V or the channel region CR reaches a target level of the erase voltage VERS at T2, the voltage generation circuit VGC may output a second word line voltage having the second capacity. As described with reference to FIG. 14, the second capacity may be smaller than the first capacity. A voltage of the word line (or word lines) may decrease with a slope that is smaller than a slope in which it decreases during the hold time period.

The gradual erase interval may be secured relatively long by combining the method described with reference to FIG. 14 and the method described with reference to FIG. 20.

Figure 23:
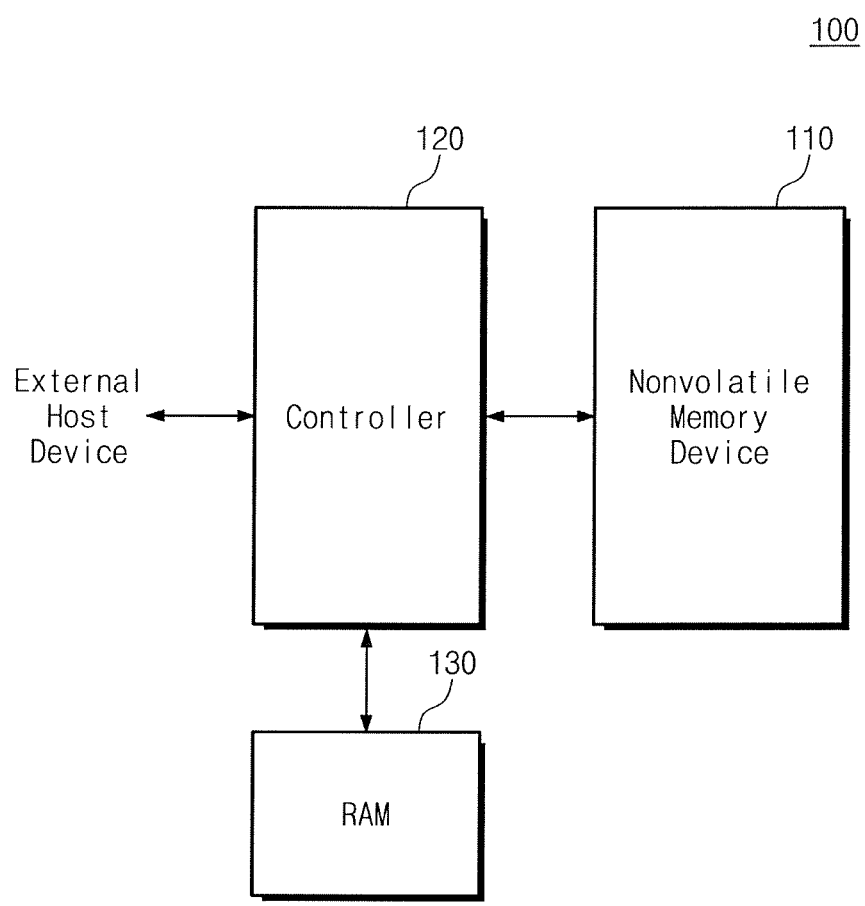
FIG. 23 is a block diagram illustrating a storage device according to an embodiment of the inventive concept.

FIG. 23 is a block diagram illustrating a storage device 100 according to an embodiment of the inventive concept. Referring to FIG. 23, the storage device 100 includes the nonvolatile memory device 110, a controller 120, and a random access memory (RAM) 130.

The nonvolatile memory device 110 may perform write, read, and erase operations under control of the controller 120. The nonvolatile memory device 110 may receive a command and an address from the controller 120 through an input/output channel. The nonvolatile memory device 110 may exchange data with the controller 120 through the input/output channel.

The nonvolatile memory device 110 may be configured and operate the same as the nonvolatile memory device 110 described with reference to FIGS. 1 to 22. For example, the nonvolatile memory device 110 may include a 3D memory cell array described with reference to FIG. 2. As described with reference to FIG. 8, the nonvolatile memory device 110 may erase memory cells by using the gradual erase interval and the fixed erase interval. Accordingly, the nonvolatile memory device 110 and the storage device 100 may have improved reliability.

The nonvolatile memory device 110 may include a flash memory. However, embodiments of the inventive concept need not be limited thereto. For example, the nonvolatile memory device 110 may incorporate at least one of nonvolatile memory devices, such as a phase-change RAM (PRAM), a magnetic RAM (MRAM), a resistive RAM (RRAM), and a ferroelectric RAM (FeRAM).

The controller 120 may be configured to control the nonvolatile memory device 110. For example, the controller 120 may control the nonvolatile memory device 110 through the input/output channel and the control channel such that the nonvolatile memory device 110 performs a write, read or erase operation.

The controller 120 may control the nonvolatile memory device 110 in response to control of an external host device (not illustrated). For example, the controller 120 may communicate with the external host device based on the format different from the format for communications with the nonvolatile memory device 110. A unit of data that the controller 120 conveys to the nonvolatile memory device 110 may be different from a unit of data that the controller 120 conveys to the external host device.

The controller 120 may use the RAM 130 as a working memory, a buffer memory, or a cache memory. The controller 120 may store data or codes, which are needed to manage the nonvolatile memory device 110, in the RAM 130. For example, the controller 120 may read data or codes, which are needed to manage the nonvolatile memory device 110, from the nonvolatile memory device 110 and may load the read data or codes on the RAM 130 for driving.

The RAM 130 may include at least one of a variety of random access memories, such as a static RAM (SRAM), a dynamic RAM (DRAM), a synchronous DRAM (SRAM), a phase-change RAM (PRAM), a magnetic RAM (MRAM), a resistive RAM (RRAM), and a ferroelectric RAM (FRAM).

The storage device 100 may include a solid state drive (SSD) or a hard disk drive (HDD). The storage device 100 may include memory cards, such as PC card (personal computer memory card international association (PCM-CIA)), compact flash (CF) card, smart media card (e.g., SM, SMC), memory stick, multimedia card (e.g., MMC, RS-MMC, MMCmicro), SD card (e.g., SD, miniSD, microSD, SDHC), universal serial bus (USB) memory card, and universal flash storage (UFS). The storage device 100 may include embedded memories, such as embedded MultiMedia card (eMMC), universal flash storage (UFS), and PPN (Perfect Page NAND).

In FIG. 23, an embodiment is exemplified as the storage device 100 includes the RAM 130 disposed on the outside of the controller 120. However, the scope and spirit of the inventive concept need not be limited thereto. For example, the storage device 100 need not include the RAM 130 disposed on the outside the controller 120. The controller 120 may be configured to use an internal RAM as a buffer memory, a working memory, or a cache memory.

According to embodiments of the inventive concept, memory cells may be erased through a gradual erase interval and a fixed erase interval even though the coupling between bodies and control gates of the memory cells increases due to a three-dimensional structure of a nonvolatile memory device. Accordingly, a nonvolatile memory device with improved reliability and an operating method thereof may be provided.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A nonvolatile memory device, comprising:
   a memory cell array comprising a plurality of memory blocks, each of the plurality of memory blocks including a plurality of memory cells stacked on a substrate in a direction perpendicular to the substrate;
   a row decoder circuit connected to the plurality of memory cells through a plurality of word lines and selecting a first memory block of the plurality of memory blocks;
   a page buffer circuit connected to the plurality of memory cells through a plurality of bit lines; and
   a control logic circuit to apply an erase voltage to the substrate during an erase operation and to output a word line voltage having a first word line voltage and a second word line voltage to the row decoder circuit,
   wherein during the erase operation, the row decoder circuit applies the first word line voltage to each word line of the first memory block and then applies the second word line voltage to each word line of the first memory block,
   wherein the first word line voltage is applied in an interval in which a level of the erase voltage increases, and
   wherein the second word line voltage is applied in an interval in which the erase voltage has reached a target level.

2. The nonvolatile memory device of claim 1, wherein the control logic circuit includes a voltage generation circuit outputting the word line voltage,
   wherein the first word line voltage is applied to each word line of the first memory block at a first capacity,
   wherein the second word line voltage is applied to each word line of the first memory block at a second capacity, and
   wherein the first capacity is greater than the second capacity.

3. The nonvolatile memory device of claim 1, wherein the first word line voltage is a global ground voltage supplied from the outside of the nonvolatile memory device, and
   wherein the second word line voltage is a voltage generated from the control logic circuit.

4. The nonvolatile memory device of claim 3, wherein the second word line voltage is a positive voltage higher than the first word line voltage.

5. A nonvolatile memory device, comprising:
   a memory cell array comprising a plurality of memory blocks, each of the plurality of memory blocks including a plurality of memory cells stacked on a substrate in a direction perpendicular to the substrate;
   a row decoder circuit connected to the plurality of memory cells through a plurality of word lines and selecting a first memory block of the plurality of memory blocks;
   a page buffer circuit connected to the plurality of memory cells through a plurality of bit lines; and
   a control logic circuit to apply an erase voltage to the substrate during an erase operation and to output a word line voltage having a first word line voltage and a second word line voltage to the row decoder circuit,
   wherein during the erase operation, the row decoder circuit applies the first word line voltage to each word line of the first memory block and then applies the second word line voltage to each word line of the first memory block, wherein the first word line voltage is a global ground voltage supplied from the outside of the nonvolatile memory device, and wherein the second word line voltage is a voltage generated from the control logic circuit, wherein the first word line voltage is applied until a level of the erase voltage rises to an intermediate level lower than a target level of the erase voltage, and wherein the second word line voltage is applied while a level of the erase voltage rises to the target level from the intermediate level and maintains the target level.

6. The nonvolatile memory device of claim 5, wherein the target level is adjustable.

7. The nonvolatile memory device of claim 1, wherein each of the first word line voltage and the second word line voltage is a positive voltage.

8. The nonvolatile memory device of claim 5, wherein the first word line voltage is applied while the erase voltage increases to the target level, and wherein the second word line voltage is applied while the erase voltage is maintained at the target level.

9. The nonvolatile memory device of claim 7, wherein the first word line voltage is applied while the erase voltage increases to the target level, wherein the first word line voltage is also applied for a predetermined time after the erase voltage reaches the target level, wherein the second word line voltage is applied after the predetermined time and while the erase voltage is maintained at the target level.

10. The nonvolatile memory device of claim 5, wherein the first word line voltage has a fiat capacity, wherein the second word line voltage has second capacity, wherein the control logic circuit further generates a third word line voltage at a third capacity, wherein during the erase operation, the control logic circuit adjusts the second word line voltage and the second capacity to the third word line voltage and the third capacity, respectively.

11. The nonvolatile memory device of claim 10, wherein the first word line voltage is applied until the erase voltage rises to the intermediate level lower than the target level of the erase voltage, and wherein the second word line voltage is applied until the erase voltage rises to the target level, wherein the third word line voltage is applied while the erase voltage is maintained at the target level.

12. The nonvolatile memory device of claim 1, wherein the erase operation comprises a plurality of erase loops, each of the plurality of erase loops including an erasing operation and an erase verifying operation, wherein the erase voltage, the first word line voltage, and the second word line voltage are applied during the erasing operation of each of the plurality of erase loops.

13. An erasing method of a nonvolatile memory device that comprises a plurality of memory cells stacked on a substrate in a direction perpendicular to the substrate, the method comprising:

erasing the plurality of memory cells in a gradual erase interval in which an amount of charges discharged from the memory cells gradually increases and in a fixed erase interval in which a voltage difference between the substrate and a control gate of each of the plurality of memory cells is maintained as constant, wherein the erasing of the plurality of memory cells is performed by at least one of:

applying a first erase voltage to the substrate and applying a first voltage and a second voltage to the control gate of each of the plurality of memory cells, wherein a capacity of the second voltage is smaller than a capacity of the first voltage and wherein the applying of the first voltage is followed by the applying of the second voltage; and applying a second erase voltage higher than the first erase voltage to the substrate with at least one hold time period and applying a word line voltage to the control gate of each of the plurality of memory cells, wherein a voltage of the substrate is maintained for the at least one hold time period, and wherein a voltage of the control gate of each of the plurality of memory cells increases until each of the at least one hold time period starts and the voltage of the control gate of each of the plurality of memory cells decreases for each of the at least one hold time period.

* * * * *